United States Patent [19]
Alpay et al.

[11] Patent Number: 5,415,953
[45] Date of Patent: May 16, 1995

[54] PHOTOMASK BLANKS COMPRISING TRANSMISSIVE EMBEDDED PHASE SHIFTER

[75] Inventors: Hakki U. Alpay, Highland, N.Y.; Roger H. French; Franklin D. Kalk, both of Wilmington, Del.

[73] Assignee: E. I. du Pont de Nemours and Company, Wilmington, Del.

[21] Appl. No.: 195,670

[22] Filed: Feb. 14, 1994

[51] Int. Cl.$^6$ .............................................. G03F 9/00
[52] U.S. Cl. ............................................ 430/5; 428/34; 428/448
[58] Field of Search ............... 430/5; 427/34, 448

[56] References Cited

U.S. PATENT DOCUMENTS

| | | | |
|---|---|---|---|
| 4,415,262 | 11/1983 | Koyama et al. | 430/5 |
| 4,890,309 | 12/1989 | Smith et al. | 378/35 |
| 5,187,726 | 2/1993 | White | 378/35 |
| 5,230,971 | 7/1993 | Alpay | 430/5 |

FOREIGN PATENT DOCUMENTS

| | | |
|---|---|---|
| 0203563 | 12/1986 | European Pat. Off. |
| 2650817 | 11/1977 | Germany |
| 2-242252 | 9/1990 | Japan |
| 4-125643 | 4/1992 | Japan |
| 5-127361 | 5/1993 | Japan |

OTHER PUBLICATIONS

Aspnes, D. E., *Handbook of Optical Constants of Solids*, Chap. 5, pp. 89–112, 1985.
"Si–N Attenuated Phase Shift Layer for Phase Shift Mask Application", *IBM Technical Disclosure Bulletin*, 35(3), 440–441, Aug. 1992.
Heavens, O. S., "Optical Properties of Thin Solid Films", Dover Publications, N.Y., 1965, 69–80.
Lin, B. J. "The Attenuated Phase-Shifting Mask", *Solid State Technology*, 35(1), 43–47, Jan. 1992.

*Primary Examiner*—S. Rosasco

[57] ABSTRACT

Transmissive embedded phase shifter-photomask blanks are disclosed which comprise an optically inhomogeneous attenuating film which has a transmission of at least 0.001 at the lithographic wavelength and consists essentially of a combination of multiple components with one of the components having a higher absorbance than another at the lithographic wavelength, One depth from a surface of the films has a higher content of the higher absorbing component than another depth and the profile of change in refractive index and/or extinction coefficient is gradual through the film thickness, Said profile(s) of change and the film thickness are selected to provide a phase shift of about 180° (or an odd multiple thereof) at a selected lithographic wavelength.

15 Claims, 28 Drawing Sheets

PHOTOMASK BLANKS COMPRISING TRANSMISSIVE EMBEDDED PHASE SHIFTER

FIELD OF THE INVENTION

This invention relates to photomask blanks, and more particularly, to photomask blanks providing phase shift in incident light at a specified wavelength.

BACKGROUND OF THE INVENTION

Conventional photomask blanks commonly consist of a substrate, e.g., fused silica plate, on which is an opaque chrome film. Photomasks are produced from these blanks by providing a desired pattern of open areas in the film. In use, light is optically projected through the open areas of the photomask onto the surface of a light sensitive substrate, such as a photopolymer-coated semiconductor wafer. Currently, photomasks are illuminated with visible or ultraviolet light. A fundamental limitation of optical imaging is that line widths of the order of the wavelength of the illuminating light are diffraction limited. In other words, light having a wavelength of the same order of magnitude as the desired optical image will diffract, and the projected image will be wider than the desired image.

To allow for patterns narrower than the wavelength of visible or ultraviolet light to be produced, the art has considered changing to a shorter wavelength source, such as X-ray. U.S. Pat. No. 4,890,309 discloses a type of attenuated (as opposed to opaque) photomask, particularly useful in X-ray lithography, wherein the material and thickness of the attenuating film are selected to both pass (i.e., transmit) a fraction of the incident electromagnetic radiation and to phase shift the radiation relative to radiation passing through the open features of the mask. The materials of choice are homogeneous films of tungsten, gold, silver, alloys of these materials or alternating layers of high and low atomic number materials (e.g., tungsten and carbon).

In an effort to avoid the cost and complexity of X-ray lithography, a variety of phase-shifting photomasks have been developed for ultraviolet and visible light ranges (see, for example, B. J. Lin, Solid State Technology, pp. 43–47, January, 1992). Among these are the rim phase-shifting photomask, which requires either substrate etching or the use of an additional phase-shifting layer. The rim phase-shifting photomask is inherently applicable to arbitrary mask patterns, but requires a large positive mask bias to reduce exposure times to a practical level and due to strong proximity effects it is difficult to delineate all feature sizes and shapes for an arbitrary mask pattern using one common exposure. An improvement over the rim phase-shifting photomask is known in the art as the attenuated phase-shifting photomask (APSPM). APSPMs employ an absorptive, partially transmitting, phase shifter in place of the conventional opaque chromium part of the patterned film. The transmission of the absorptive phase shifter is adjusted to less than about 0.20 to prevent creation of ghost lines. However, not all phase shifters can phase shift and absorb by the desired amount. Consequently, a multi-layered structure consisting of materials of differing absorptive and phase shifting properties may be required in some cases. A commercially available APSPM utilizes a graded chromium oxycarbonitride composition film which varies from a Cr-N compound at the substrate-film interface to a Cr-O compound at the film-air interface, which also serves as an anti-reflective coating. While this APSPM provides a degree of phase shifting, a further procedure, such as reactive ion etching of the substrate, in this case, fused silica, is necessary to achieve the desired 180° phase shift.

Japanese laid-open patent application No. Heisei 5-127,361 describes an attenuating photomask blank with a partially transmitting film that provides both the desired transmission and phase shift, i.e., the phase shift is embedded in the absorbing layer. This is achieved by the use of a depthwise optically homogeneous film material with appropriate index of refraction and extinction coefficient. A disadvantage of this depthwise homogeneous film is that, because the index of refraction and extinction coefficient are coupled, the transmission, phase shift, and reflectivity cannot be separately selected. In general, lithographic imaging performance is affected by transmission, phase shift, and reflectivity, so independent control of these three parameters is desirable. Another disadvantage of this homogeneous film is that when chromium compounds are used as specified in the claims, the electrical resistivity is high, rendering the film unwritable in an electron beam patterning system unless a separate charge dissipation layer is used. A further disadvantage of this homogeneous film is that when chromium compounds are used, the spectral optical transmission is very high in the visible portion of the spectrum, causing difficulty in inspecting the finished photomask (customarily done at 488 nm) and aligning the finished photomask in the projection aligner (customarily done at 633 nm).

The use of a depthwise optically inhomogeneous film to simultaneously achieve the desired transmission, phase shift, and reflectivity in an attenuated phase shifting photomask blank is described in U.S. patent application Ser. No. 07/976,782, now abandoned, filed Nov. 16, 1992. The inhomogeneous attenuating film consists essentially of a combination of a metallic component and a dielectric component, wherein one surface of the film has a higher content of metallic component than the other surface, and the profile of change in the extinction coefficient is gradual through the film thickness; and wherein said profile of change and the film thickness are selected to provide a phase shift of about 180° (or an odd multiple thereof) at the selected wavelength. This inhomogeneous film allows flexible design and construction of photomask blanks with independent control of transmission, phase shift, and reflectivity. However, it specifies a depthwise composition gradient between a metallic component and a dielectric component.

SUMMARY OF THE INVENTION

This invention provides a transmissive embedded phase shifter-photomask blank (i.e., an EPS-PMB) for a selected lithographic wavelength which comprises an optically inhomogeneous attenuating film with an upper surface and a lower surface. The film has a transmission of at least 0.001 at the lithographic wavelength and consists essentially of a combination of at least two components wherein at least one component exhibits a higher absorbance than at least one other component at the lithographic wavelength; wherein one depth from the upper surface of the film has a higher content of said higher absorbing component than another depth from the upper surface, and the profile of change in the refractive index and/or in the extinction coefficient is/are gradual through the film thickness; and wherein said profile(s) of change and the film thickness are selected to provide a phase shift of about 180° (or an odd multiple thereof) at the selected lithographic wavelength.

SUMMARY OF TERMS USED IN DRAWINGS

Figure 1:
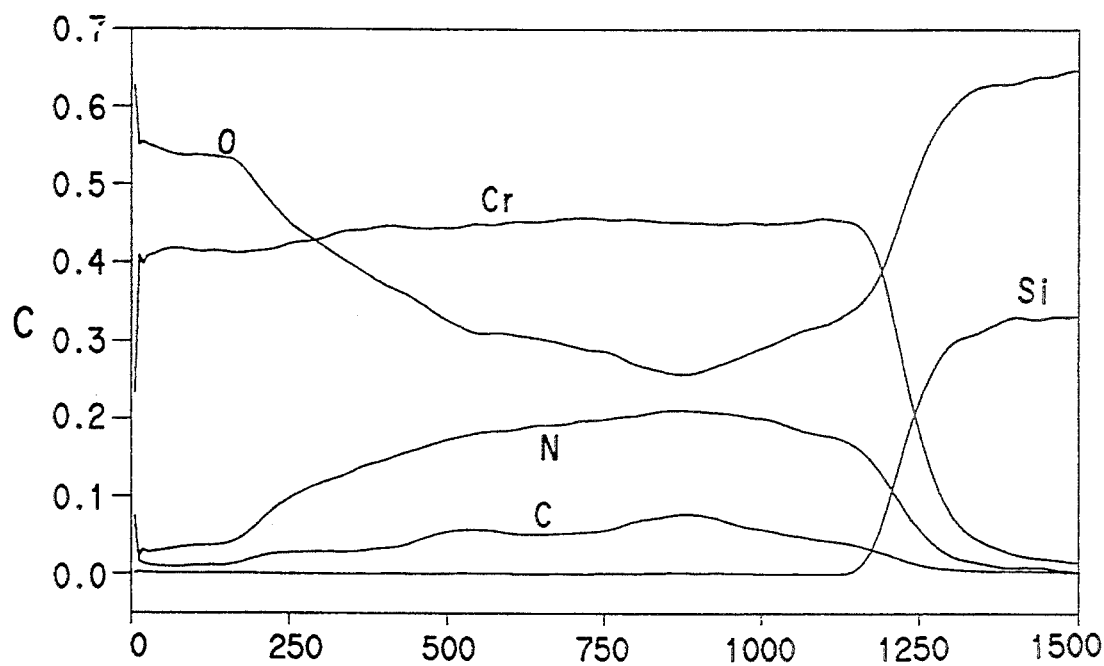
FIG. 1 represents a compositional depth profile of a EPS-PMB provided in accordance with this invention having a 0.054 transmission at 365 nm wavelength.

X Film Depth from Interface (Angstroms)
Y Film Depth from Surface (Angstroms)
C Atomic Concentration
W Wavelength (nanometers)
T Absolute Transmission
S Psi (degrees)
D Delta (degrees)
n Index of refraction
k Extinction Coefficient
P Phase Shift (degrees)
L Position along Interferometer Scan
R Reflectance

DETAILED DESCRIPTION OF THE INVENTION

This invention provides an advantageous film for photomask blanks. The film provides a phase shift of about 180° (preferably 180°±10°) or an odd multiple thereof, for particular incident wavelengths, and is thus especially useful for producing photomasks. Normally the film is deposited on a substrate. The substrate can be any mechanically stable material which is transparent to the wavelength of incident light used. Substrates such as quartz and fused silica (glass) are preferred for availability and cost.

The films of this invention are optically inhomogeneous, in that the refractive index and/or extinction coefficient change(s) through the film thickness. The optically inhomogeneous attenuating film in accordance with the instant invention is typically in the form of a continuously varying structure ranging from optically more absorbing characteristics at the lower surface (normally a substrate-film interface) to optically less absorbing characteristics at the upper surface (normally a film-air interface); or in the form of a continuously varying structure ranging from optically less absorbing characteristics at the lower surface (normally a substrate-film interface) to optically more absorbing characteristics at a location partially through the film thickness to optically less absorbing characteristics at the upper surface (normally a film-air interface); or in the form of a continually varying structure ranging from optically more absorbing characteristics at the lower surface (normally a substrate-film interface) to optically less absorbing characteristics at a location partially through the film thickness to optically more absorbing characteristics at the upper surface (normally a film-air interface). At any depth in the optically inhomogeneous film, the material can be defined to be a mixture of at least two components, at least one more absorbing component and at least one less absorbing component. The index of refraction of the more absorbing component(s) is generally from 1 to 6, and is preferably from 2 to 5; and the index of refraction of the less absorbing component(s) is generally from 1 to 3.5, and is preferably from 1.2 to 2.8. The extinction coefficient of the more absorbing component(s) is generally from 0 to 6 and is preferably from 0.5 to 3.5. The extinction coefficient of the less absorbing component(s) is generally from 0 to 2 and is preferably from 0 to 1.5. The more absorbing and less absorbing components of the inhomogeneous attenuating film can be selected from materials such as transition, and non-transition, metal fluoro-oxy-carbo-nitrides. Materials which are particularly suited to the practice of this invention are metal oxy-carbo-nitrides (i.e., M-O-C-N), metal chloro-oxy-carbo-nitrides (i.e., M-Cl-O-C-N), metal chloro-fluoro-oxy-carbo-nitrides (i.e., M-Cl-F-O-C-N) and metal fluoro-oxy-carbo-nitrides (i.e., M-F-O-C-N) where M is selected from the group consisting of Cr, Fe, Mo, Zn, Co, Nb, Ta, W, Ti, Al, Mg, Si, and mixtures thereof. Cr is a preferred M; and chromium oxy-carbonitride is a preferred material based upon performance and availability.

The profile of the film's refractive index, the profile of the film's extinction coefficients or both profiles change gradually through the film thickness. The gradual change can be accomplished in a smooth continuous manner and/or in a stepwise graded manner. The films of this invention are multicomponent compositions, wherein one component has a higher absorbancy than another component at the lithographic wavelength. The absorbance, $\alpha$, as used herein for each component is directly proportional to the extinction coefficient, k, for that component (i.e., $\alpha = 4\pi k/\lambda$ wherein $\lambda$ is the wavelength of incident light). In many embodiments, the film composition is essentially a combination of two components. These two components may be a metallic component (i.e., a material characterized by an extinction coefficient within the range of 0 to 6 which generally decreases in magnitude with increasing photon energy in the range from 1.5 to 6.5 eV) and a dielectric component (i.e., a material characterized by an extinction coefficient within the range of 0 to 2 which generally increases in magnitude with increasing photon energy in the range from 1.5 to 6.5 eV) combined so that the profile of change in the extinction coefficient and the film thickness provide a phase shift of about 180° (or an odd multiple thereof) as in copending U.S. patent application Ser. No. 07/976,782; or the two components may be another combination in accordance with this invention. Indeed, two dielectric materials (i.e., two materials characterized by an extinction coefficient which generally increases with increasing photon energy within the range of 1.5 to 6.5 eV) may be used so long as one has a higher absorbancy (i.e., a higher extinction coefficient) than the other. The use of two dielectric material facilitates achieving transmissions at I-line and G-line lithographic wavelengths of about 0.04 and above (e.g., between 0.04 and 0.50); and transmissions at DUV lithographic wavelengths of about 0.01 and above (e.g., between 0.01 and 0.12).

At a depth, D, in a film consisting essentially of a combination of two components, the film's refractive index and extinction coefficient are related to its dielectric constant $\epsilon(D)$ by the following equations:

$$\epsilon_1(D) = \frac{n^2(D) - k^2(D)}{\mu(D)}$$

$$\epsilon_2(D) = \frac{2n(D)k(D)}{\mu(D)}$$

$$\epsilon(D) = \epsilon_1(D) + \epsilon_2(D)$$

where n(D) is the refractive index at depth D, k(D) is the extinction coefficient at depth D, and $\mu(D)$ is the magnetic permeability at depth D.

For the purpose of this invention, at a depth D in the film, the dielectric constant is defined as a combination of the dielectric constants of the two component materials by the following equation:

$$f_a(D) \frac{\epsilon_a(D) - \epsilon(D)}{\epsilon_a(D) + 2\epsilon(D)} = f_b(D) \frac{\epsilon(D) - \epsilon_b(D)}{\epsilon_b(D) + 2\epsilon(D)}$$

where $\epsilon_a(D)$ and $\epsilon_b(D)$ are the dielectric constants of the two component materials at depth D, and $f_a(D)$ and $f_b(D)$ are the volume fractions of the two component materials at depth D. This equation is a statement of the Bruggeman effective medium approximation (described more fully in "The Accurate Determination of Optical Properties by Ellipsometry," by D. E. Aspnes, in "Handbook of Optical Constants of Solids," edited by Edward D. Palik, Academic Press, Orlando, 1985, pp. 89-112 which is hereby incorporated herein by reference). In the Bruggeman effective medium approximation, $f_a(D) + f_b(D) = 1$. The dielectric functions of the two components are not limited to be either metallic or dielectric in nature. As long as the equations above are satisfied, the depth profiles of refractive index and extinction coefficient can be quite general. The film need not consist, at any depth, of just the more absorbing component (i.e., $f_a(D) = 1$) or just the less absorbing component (i.e., $f_b(D) = 1$).

It will be evident to one skilled in the art that a parallel but more complex analysis can be made where there are more than two components.

For the purpose of this invention, the optically inhomogeneous film must have a degree of transparency sufficient for the phase shift provided by the film to have the desired effect on the line width produced by the photomask. The maximum thickness of the film used in the photomask blank, $d_{max}$, may be estimated in terms of index of refraction of the dielectric component of the least absorbing component of the film, $n_{min}$, and the wavelength, $\lambda$, of light used, by:

$$d_{max} = \frac{(m\lambda)}{(2(n_{top} - 1))}$$

$$d_{max} = \frac{m\lambda}{2(n_{min} - 1)}$$

where m is an odd positive integer. In practice, m is typically equal to 1 or 3, but it is not limited to such, for example, in the X-ray region. For a wavelength of 365 nanometers and $n_{min} = 1.5$, $d_{max} = 365$ m nanometers. The equation is valid for the films of this invention which are not essentially opaque (i.e., the transmission of the film at the lithograph wavelength remains above 0.001).

Based on this definition of the maximum thickness, the volumes of the more absorbing and less absorbing components can vary in thickness from essentially 0 to a thickness defined by the requirement that these inhomogeneous attenuating films have sufficient transparency. Typically, the more absorbing component is from 5 nanometers to 150 nanometers thick, and the less absorbing component is from 10 nanometers to 400 nanometers thick.

An important feature of this invention is that the composition of the film can be designed in accordance with multiple requirements that the film have the 180° phase shift required by embedded phase shifters at the desired wavelength of light employed, that the film have the desired transmission at the wavelength of light employed, and that the film have the desired reflectance at the wavelength of light employed. Of particular note are EPS-PMBs where the lithographic wavelength is I-line, EPS-PMBs in accordance with this invention where the lithographic wavelength is DUV, and EPS-PMBs in accordance with this invention wherein the lithographic wavelength is G-line.

Typically, desired reflectances are within the range of from 0 to about 0.5.

Figure 4A:
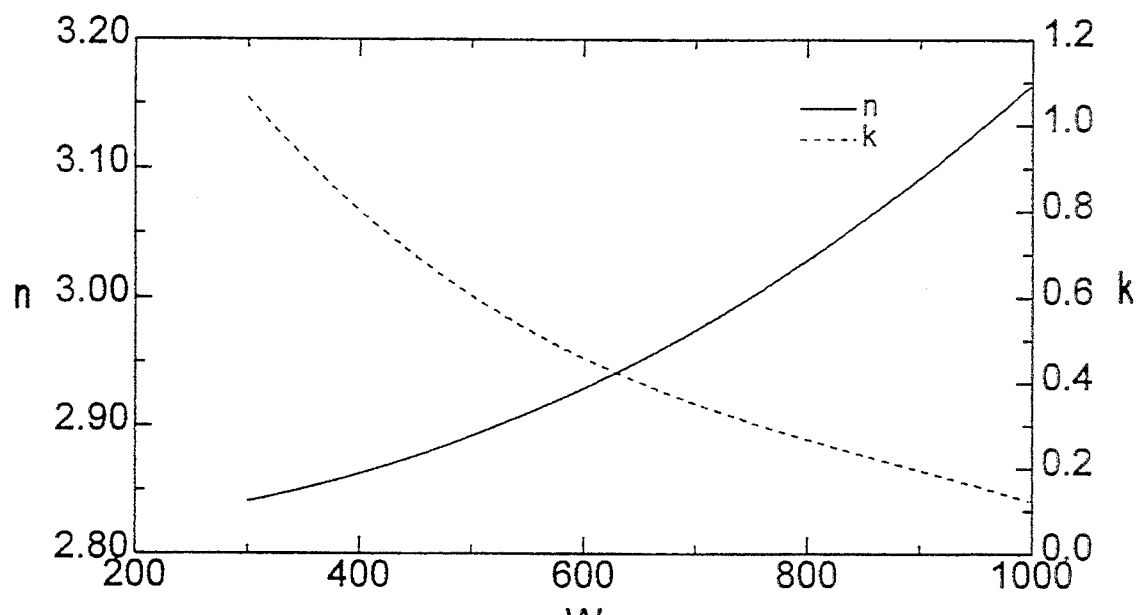
FIGS. 4a and 4b represent effective optical constants (n and k) for the more absorbing and less absorbing components, respectively, for the EPS-PMB of FIG. 1.
Figure 4B:
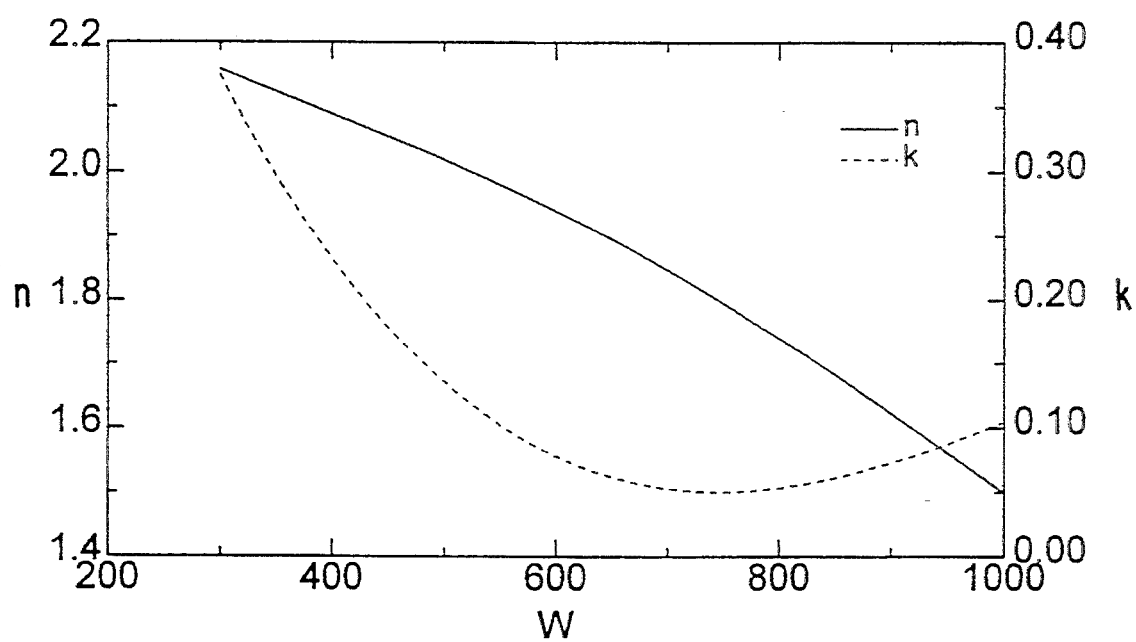

For a particular pair of more absorbing and less absorbing film components such as are shown in FIG. 4a and FIG. 4b, a generalized design may be constructed with the more absorbing component at one film surface (e.g., adjacent to the substrate), and the less absorbing component at the other film surface (e.g., adjacent to air) and a selected profile of gradual transition from more absorbing to less absorbing as discussed above. Using the index of refraction and extinction coefficient for each of the two components, along with an estimated film thickness and a selected profile of change in optical properties, one may calculate the transmission, reflectivity, and phase shift for the film. One may use the well known matrix method (see O. S. Heavens, "Optical Properties of Thin Solid Films" Dover Publications, N.Y., 1965, pp 69–80 which is hereby incorporated herein by reference) for these calculations. Computers may be used to perform the numerical computations. For a given profile, optimization of the film design is accomplished by calculating transmission, reflectivity and phase shift combinations within manufacturable ranges, and determining which combinations provide the preferred solutions. Using computerized calculations based upon the matrix method, the profile may be modeled as a large number of thin homogeneous layers, and the characteristic matrices of all the layers are matrix multiplied to calculate the reflectivity, transmission and phase shift for the film. Predetermined optical property profiles might be used, such as linear, quadratic, cubic, exponential or gaussian. In practice the profile will be constrained by the particular equipment used to manufacture the films. The equipment will also normally determine the upper and lower limits for thicknesses of regions in the film structure.

Another aspect of the invention is that the spectral optical characteristics of the inhomogeneous film can be tuned to accommodate the requirements of photomask inspection and alignment tools. Typically, these tools operate in the visible wavelength range and require low transmission (e.g., less than 0.60) at inspection and alignment wavelength(s) (typically 488 nm and 633 nm, respectively) to operate properly. The inhomogeneous film's composition profile can be adjusted so that the more absorbing component is concentrated in a relatively thin layer and provides the desired relatively flat spectral transmission response, while the layer(s) having higher concentration of the less absorbing component is thicker and provides the balance of the phase shift. For example, in M-O-C-N materials, the oxygen-deficient component may be concentrated in the relatively thin layer to facilitate alignment and inspection.

Another aspect of the invention is that the composition profile of the inhomogeneous film can be adjusted as described above for flat spectral transmission response, so that the thin more absorbing component constitutes an electrically conductive layer consistent with the requirements of electron beam exposure. Alternatively, the carbon content can be increased to decrease the sheet resistance. Electron beam writing systems require an electrically conductive layer to facilitate charge dissipation. Films having sheet resistance of about $1 \times 10^9$ ohms/sq. or less (e.g., from $1 \times 10^2$ to $1 \times 10^9$ ohms/sq.) can be readily provided in accordance with this invention for I-line and G-line lithography.

Another aspect of the invention is that the wet etching characteristics of the inhomogeneous film can be adjusted to be substantially similar to the wet etching characteristics of the opaque films used in conventional photomask processing. This is accomplished by adjusting the composition of the film, preferably the carbon concentration, to render the desired etch rate. In this sense, wet etch rate is one of the variables that is optimized when tuning the inhomogeneous film's composition depth profile. It is also clear that controlling the depth profile of the composition allows one to advantageously control the depth dependence of the film's wet etch rate, facilitating control of the film's edge wall profile. Typically, desirable etch rates are achieved for oxy-carbo-nitrides, chloro-oxy-carbo-nitrides, chloro-fluoro-oxy-carbo-nitrides and fluoro-oxy-carbo-nitrides at carbon contents of from about 0.001 to 20 atomic percent.

Typically the attenuating films consist essentially of from 99% to 1% by volume (as defined above), preferably from 85% to 5% by volume more absorbing component(s), and from 1% to 99%, preferably from 15% to 95% less absorbing component(s) based upon the total volume of the attenuating film. Photomask blanks can be prepared by methods well known in the art. A photomask blank in accordance with this invention can generally be prepared by depositing a single inhomogeneous attenuating layer on a transparent substrate in a single pass, continuous deposition process. Conventional substrates may be used as such, or may be coated with a conductive and transparent film of a material such as indium oxide or stannic oxide.

The attenuating film may be deposited on a substrate by reactive sputter deposition. Reactive sputtering is a coating process that takes place in a vacuum chamber. Within the vacuum chamber is a sputter chamber filled with a gas mixture comprising inert gas and reactive gas under a predetermined pressure. A target comprising the material to be sputtered is positioned in the sputter chamber on an electrically conductive cathode. As a negative electrical potential is applied to the target, a plasma extending from the surface of the target is formed. The plasma comprises inert and reactive gas ions and species, and atomic units of the target. The atomic target units travel through the plasma to the substrate to be coated, and react with the reactive gas species to form various compositions. The compositions are deposited in a thin film or layer on each substrate as the substrate moves through the sputter chamber. Inert gases suitable for this process include argon, neon, krypton, and xenon. Suitable reactive gases include nitrogen, oxygen, methane and carbon dioxide. Pressure in the sputter chamber is usually in the range of $3.0 \times 10^{-2}$ to $1.0 \times 10^{-3}$ Torr. The target is typically chrome or a chrome-based material, such as chromium nitride, chromium carbide or chromium oxide. Further discussion of reactive sputter deposition for photomask blank production is provided in U.S. Pat. No. 5,230,971, which is hereby incorporated by reference.

The photomask blanks of this invention, having an inhomogeneous attenuating film, may be advantageously prepared using a reactive sputter deposition technique wherein substrates are continuously moved through a sputter chamber, by providing multiple targets (e.g., chrome-based targets) placed at intervals in the direction of movement of the substrates through the sputter chamber. By controlling the conditions within the sputter chamber (e.g., the electrical charges concurrently applied to each target, for example, by direct current and/or radio frequency), the composition of the plasma over each target and the plasma overlap between targets can be adjusted to deposit onto the moving substrate a single attenuating layer having strata of different compositions and/or inter-strata transitional regions wherein the composition gradually changes from the composition of one stratum to the composition of the next resulting in an inhomogeneous attenuating layer.

This method of preparing the EPS-PMBs of this invention allows the manufacture of low stress films, and consequently allows for greater practical film thicknesses. For example, mechanically stable film thickness up to 500 nm (e.g., from 90 to 300 nm) are readily fabricated in accordance with this invention.

Through practice of this invention, one can use different component materials and vary their depthwise optical constant profiles, to optimize the multiple desirable properties of an EPS-PMB, such as the transmission, phase shift and film and substrate incident reflectance at the use wavelength, the transmission at the inspection and alignment wavelengths, the wet etch rate, the sheet resistance and the film stress. The approach presented herein of controlling the optical properties of materials comprising two or more components (including at least one relatively more absorbing component and at least one relatively less absorbing component) and their depth profile, provides the opportunity to independently specify, control and design the many different physical requirements of the resulting EPS-PMB. For example, this invention permits the setting of the phase shift of the blank to $180° \pm 10°$ while achieving (a) a transmission at the lithographic wavelength in the range of about 0.01 to 0.50 (typically 0.02 to 0.20) for a use wavelength of 365 nm (i.e., I-line) or of 436 nm (i.e., G-line) or in the range of about 0.001 to 0.25 (typically 0.01 to 0.12) for a use wavelength of 248 nm (i.e., DUV); (b) a film and substrate side reflectance at the lithographic wavelength of the EPS-PMB in the range of about 0.02 to 0.50 (typically 0.08 to 0.24); (c) a sheet resistance in the range of about $1 \times 10^2$ ohms/sq to $1 \times 10^{12}$ ohms/sq (typically $1 \times 10^3$ to $1 \times 10^9$ ohms/sq for I-line and G-line lithography, for the requirement of good charge dissipation when electron or other charged beam lithographic or repair techniques are used on the EPS-PMB); (d) a film stress in the range of about 0 to $1 \times 10^{10}$ dynes/cm$^2$ (typically from $1 \times 10^7$ to $1 \times 10^9$ dynes/cm$^2$); (e) a transmission at the inspection wavelength of 488 nm in the range of about 0.05 to 0.90 (typically 0.10 to 0.60); and/or (f) a transmission at the alignment wavelength of 633 nm in the range of 0.10 to 0.90 (typically 0.30 to 0.70).

In the embodiments of this invention where the more absorbing component of the EPS-PMB is located near a film substrate interface, the EPS-PMB normally achieves greater inspectability in comparison to an optically homogeneous EPS-PMB for the case where a defect of a thickness less than the film thickness (a film failure defect) occurs, since the remaining film on the substrate will exhibit greater contrast relative to quartz.

To facilitate creating a phase shift mask (PSM) by either wet or dry etch methods, the composition profile can be controlled such that the etch rate (using a standard acidic etchant) is in the range of 100 nm per 3 to 300 seconds, typically 100 nm per 10 to 60 seconds (e.g., acetic acid etch rates lower than the etch rate of Cr blanks can be achieved). Moreover, the EPS-PMBs of this invention have the advantage that the transmission of the film is not determined solely by the thickness of the film; and accordingly, these EPS-PMBs can be designed with a film thickness in the range of 50 to 500 nm (typically 90 to 140 nm) such that at typical etch rates the film etching can be easily controlled by etch timing to achieve the desired etch. This compares to thin Cr blanks which typically have film thicknesses of 10 to 45 nm where the etch is so rapid that etch control is degraded when controlled by standard timing.

This invention includes embodiments of transmissive EPS-PMBs which may be used with lithographic wavelengths within the range of 110 nm to 1000 nm.

Practice of the invention will become further apparent from the following non-limiting examples.

EXAMPLE 1

Two chromium targets were positioned in a commercially available direct current planar magnetron sputtering device. Each target was about six inches wide, twenty inches long and 0.25 inches high. The edge-to-edge distance between targets was about five inches. The sputter chamber was filled with a gas comprising argon, nitrogen, oxygen, carbon dioxide and methane. A polished glass substrate was moved through the sputter chamber under the conditions set forth in Table I for the 5.4% I-line EPS-PMB #3700.

Under these operating conditions, due to the light emission from the different species in the two different plasmas and the plasma overlap region, a color spectrum from bright blue over the first target changing to a bright pink over the second target was observed with the naked eye through windows provided on the side of the process chamber, confirming the existence of compositional gradient within the plasma in the direction of substrate movement. The presence of this depthwise compositional profile in the deposited film is shown in FIG. 1. In this compositional profile, one can see the optimized depthwise structure of this EPS-PMB, with increased oxygen content at the surface, increased Cr-level and nitrogen content towards the film-substrate interface and an increase in the carbon content from the surface to the film substrate interface.

Figure 2:
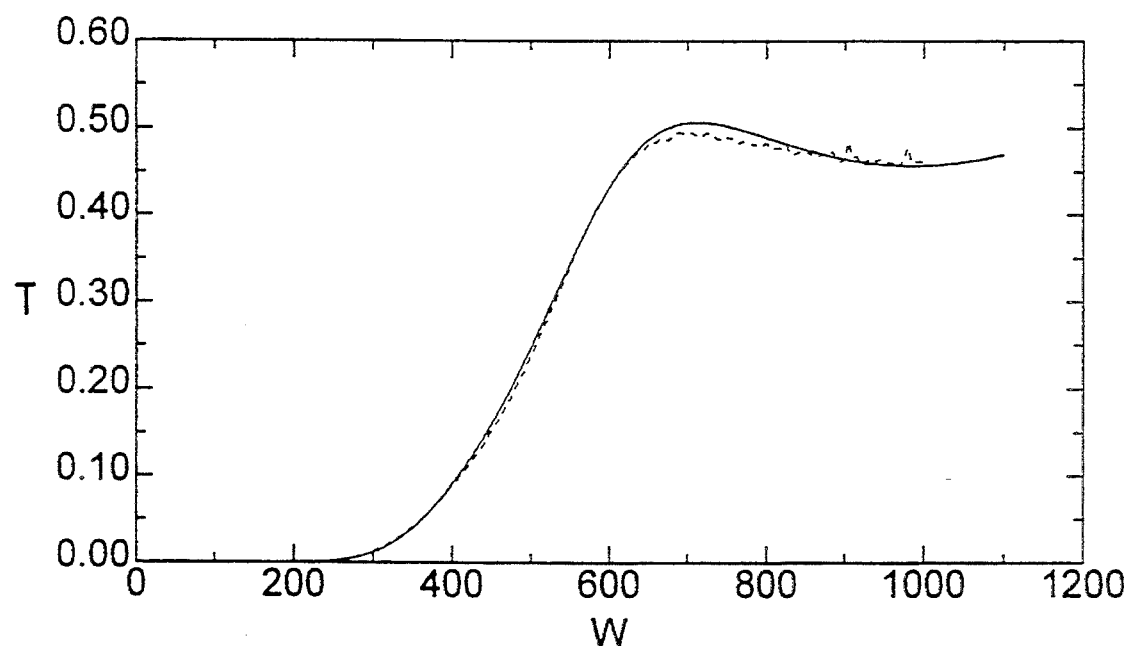
FIG. 2 represents spectral transmission of the EPS-PMB of FIG. 1.
Figure 3A:
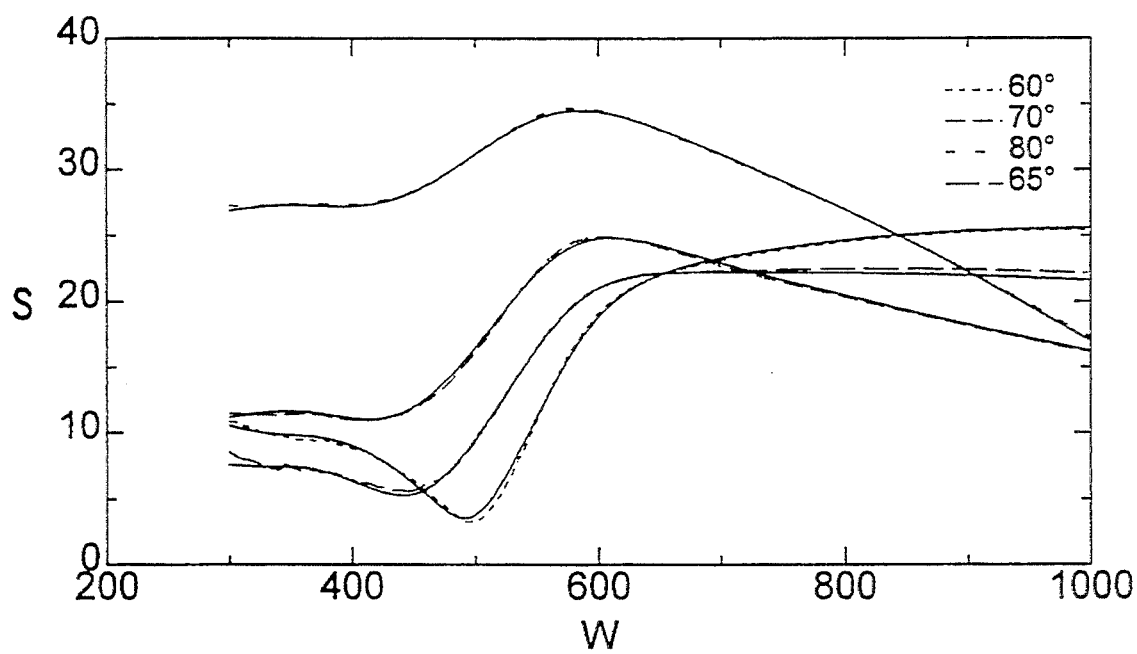
FIGS. 3a and 3b represent ellipsometric data for Psi and Delta, respectively, in degrees, for the EPS-PMB of FIG. 1.
Figure 3B:
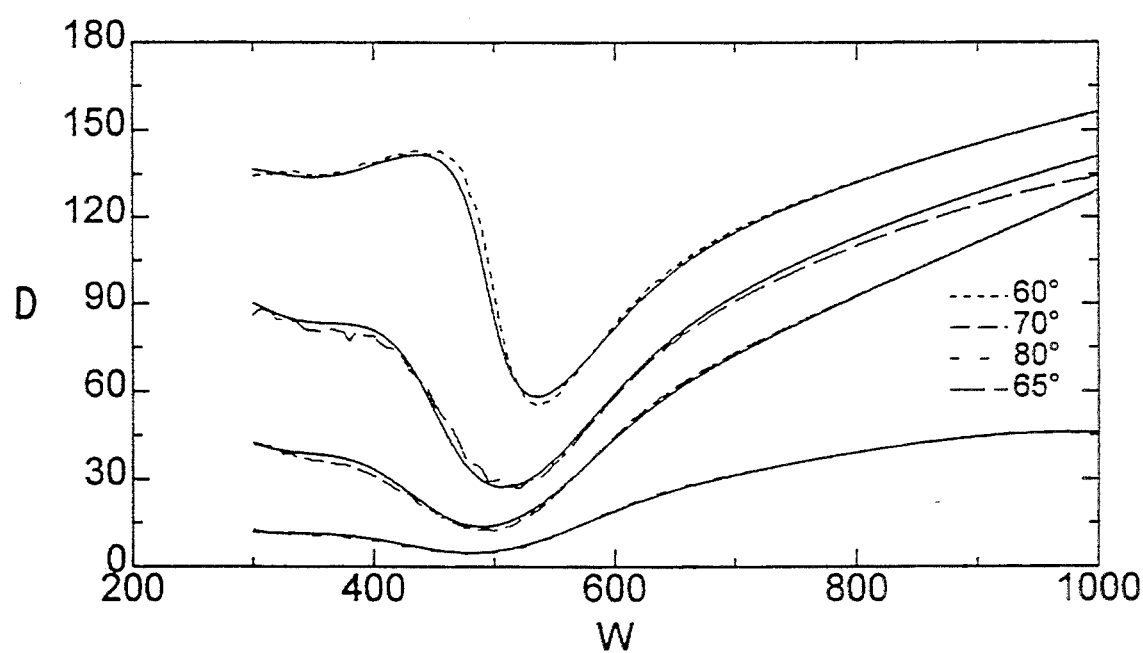
Figure 5:
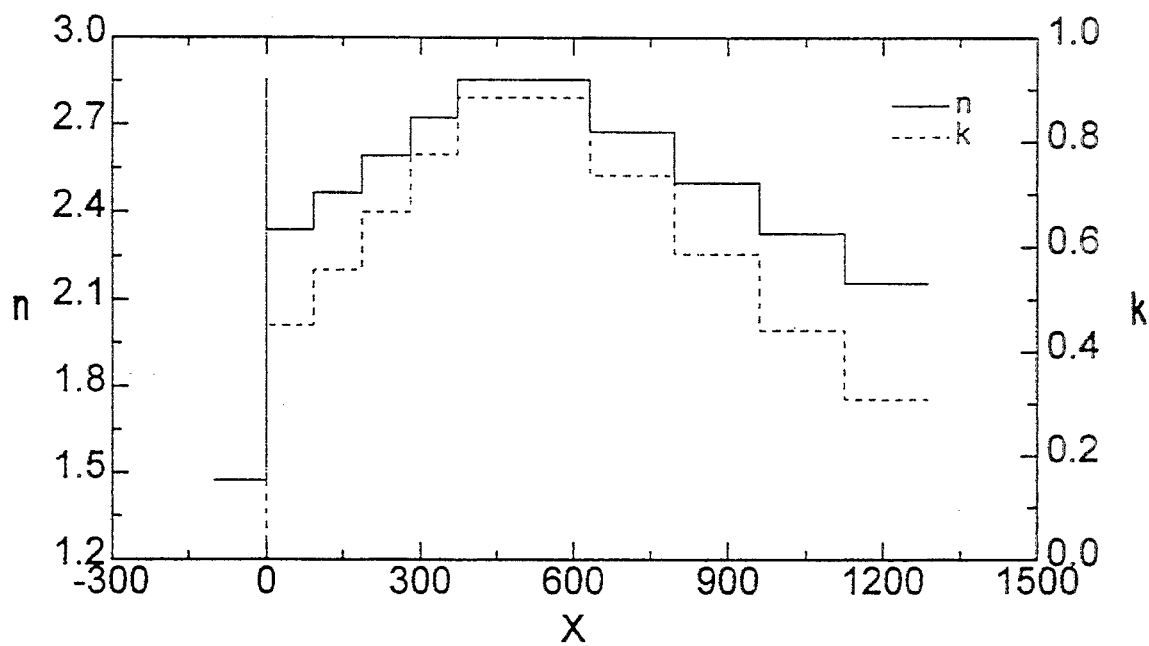
FIG. 5 represents a depth profile of effective optical constants (n and k) for the EPS-PMB of FIG. 1.

The substrates removed from the chamber had a film coating of about 111.8 nanometers, as determined by stylus profilometry, demonstrating the depthwise variation of the chromium compounds present in the depthwise optically inhomogeneous deposited film. The optical transmission (FIG. 2) and reflectivity (FIGS. 9 and 10) as well as the ellipsometric spectra (FIGS. 3a and 3b) of the air-film and substrate-film surfaces, were measured. Using these spectroscopic measurements, the optical properties such as the index of refraction and the extinction coefficients of the two component materials and also the profile of these optical properties was modeled using the matrix method described herein. The optical properties calculated for each of the two component materials of the film are shown in FIG. 4 and are of a relatively more strongly absorbing (FIG. 4a) and relatively less strongly absorbing (FIG. 4b) nature as defined above. Note that the dispersion of the extinction coefficient of both of the component materials shown in FIG. 4 have the dielectric type dispersion as opposed to one metallic and one dielectric type material as defined in copending U.S. patent application Ser. No. 07/976,782. One estimated profile of the index of refraction and the extinction coefficient, which is consistent with FIG. 4 and the measured optical and ellipsometric data was determined using the matrix method and is shown in FIG. 5. The optical constants of the two component materials of this I-line EPS-PMB #3700 are summarized in Table III for the use wavelength of 365 nm, and the depthwise variation of this depthwise inhomogeneous film's optical constants can be determined in a selfconsistent manner using the Bruggeman EMA equation described herein and the component material fractions and relative depths presented in Table III. While other profiles might also be consistent, the measured optical and ellipsometric data cannot be interpreted assuming a film with homogeneous properties.

Figure 6:
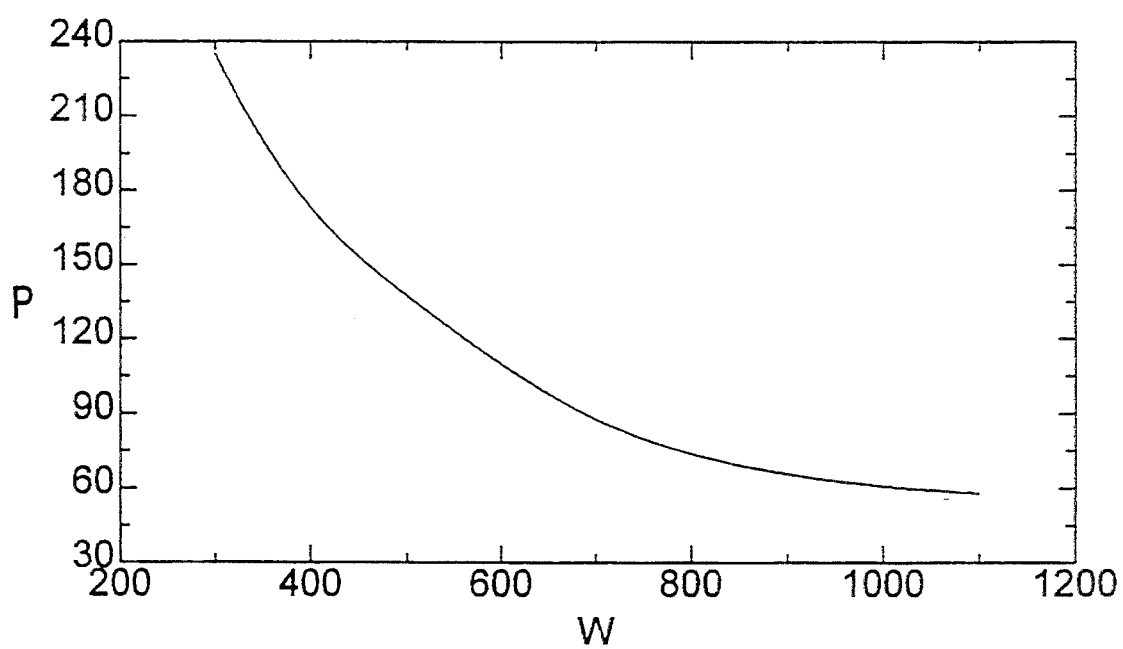
FIG. 6 represents an ellipsometrically modeled spectral phase shifts for the EPS-PMB of FIG. 1.
Figure 7A:
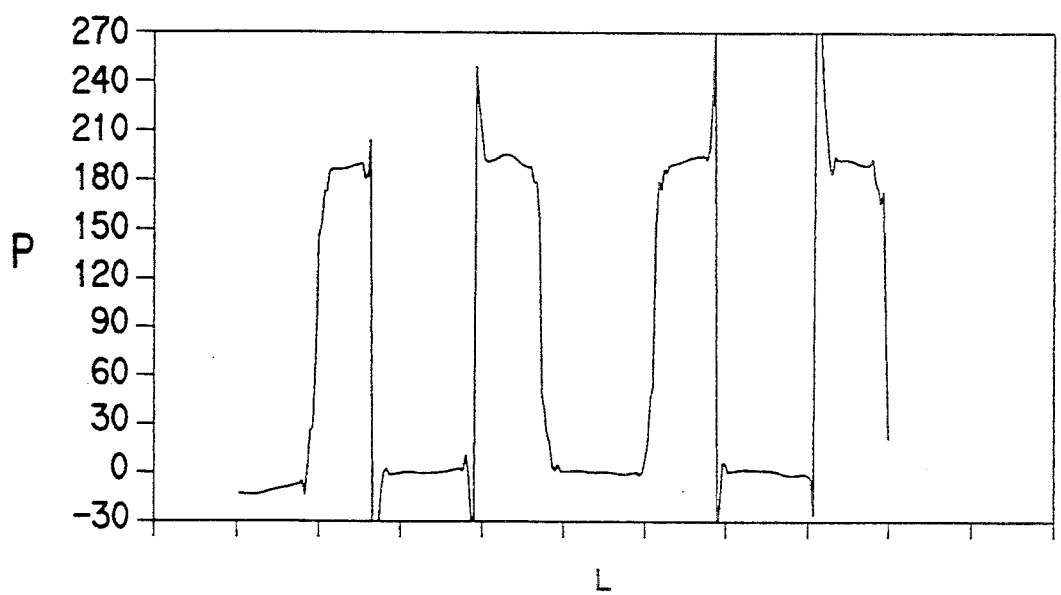
FIGS. 7a, 7b, 7c and 7d represent phase sensitive interferometer scans at 325, 442, 488 and 633 nm, respectively, for the EPS-PMB of FIG. 1.
Figure 7B:
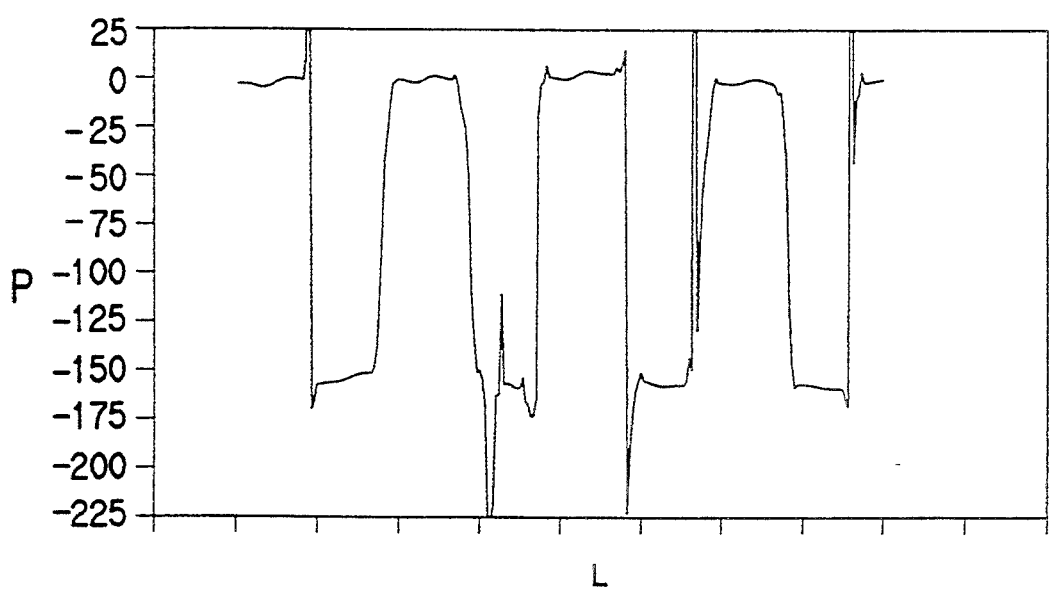
Figure 7C:
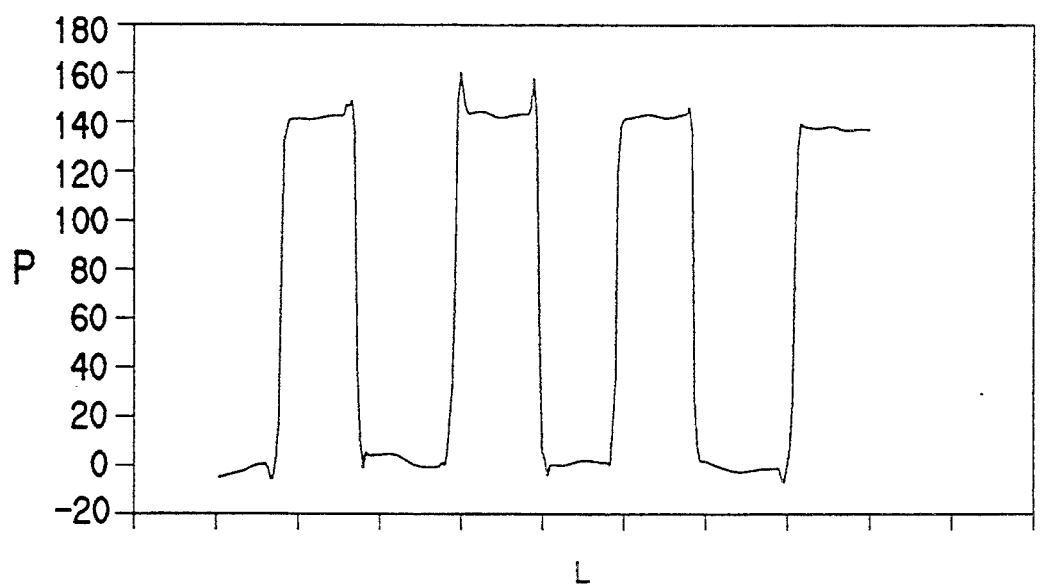
Figure 7D:
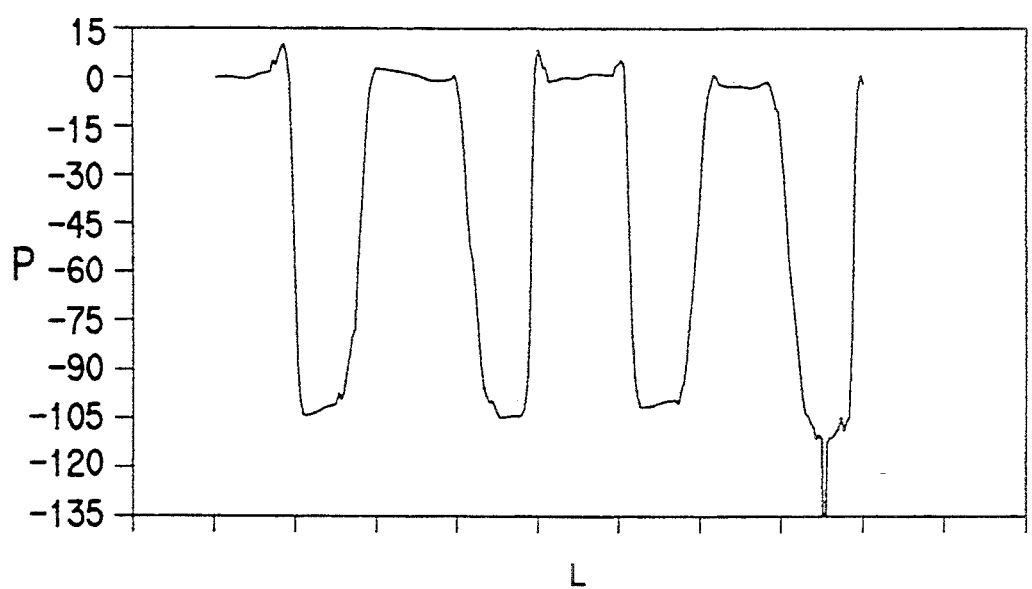
Figure 8:
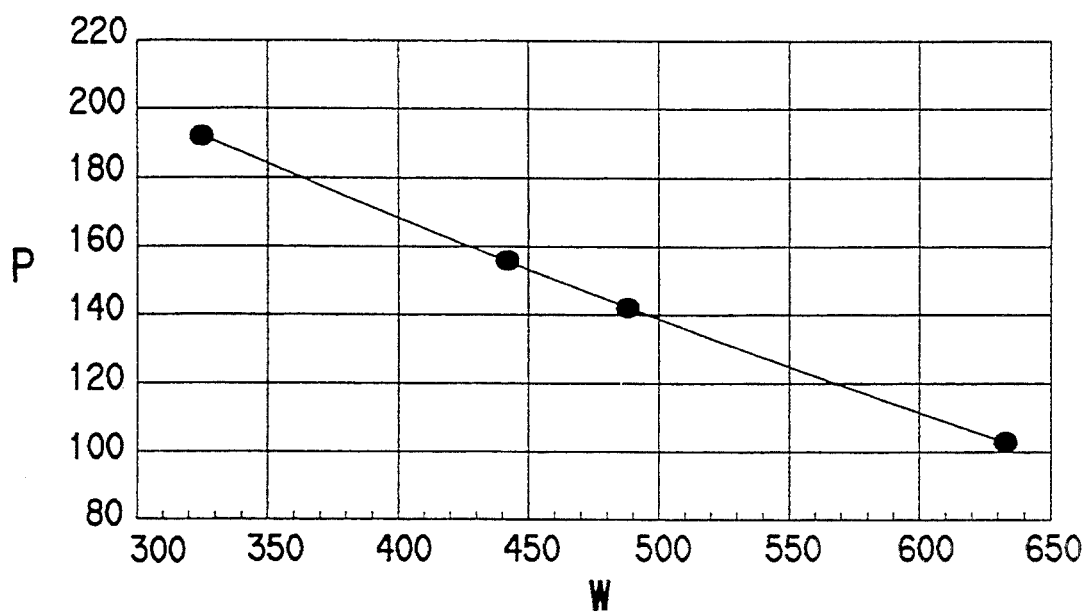
FIG. 8 represents a plot of 325, 442, 488, and 633 nm PSI data for the EPS-PMB of FIG. 1 along with a second-order curve fit to the data (the interpolated I-line phase shift is 179° for this EPS-PMB).
Figure 9:
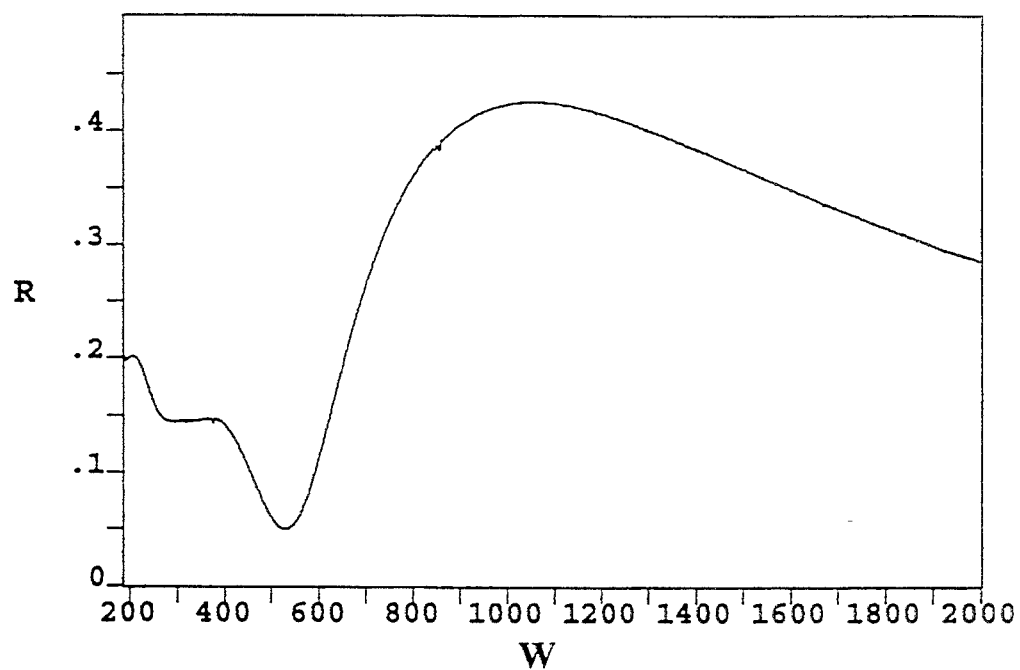
FIG. 9 represents the reflectance for light incident on the film side of the EPS-PMB of FIG. 1.
Figure 10:
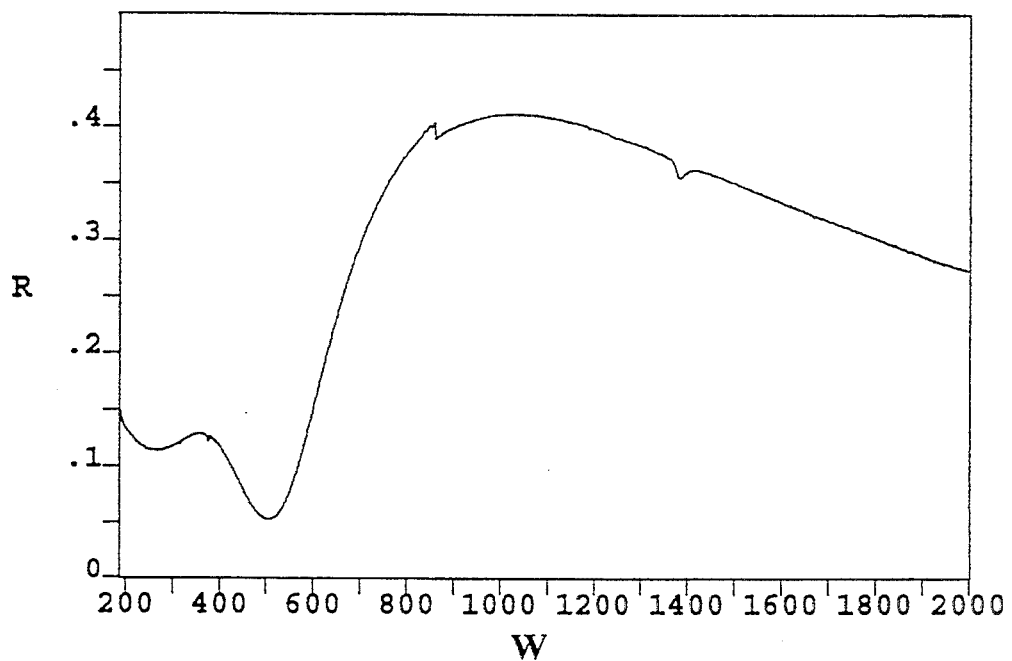
FIG. 10 represents the reflectance for light incident on the substrate side of the EPS-PMB of FIG. 1.

The transmission of the EPS-PMB #3700 produced is 0.054 at the designed I-line use wavelength of 365 nm. The spectrum of the phase shift of this EPS-PMB #3700, as determined from the matrix method derived model of the component material's optical constants and their depthwise variation, is shown in FIG. 6. At the use wavelength of 365 nm, the phase shift of the EPS-PMB #3700 is 179° as independently determined from the four phase sensitive interferometer (PSI) tool measurements (i.e., dual beam phase sensitive interferometer linear scans across the photomask blank surface) at wavelengths of 325 nm, 442 nm, 488 nm, and 633 nm (FIGS. 7a, 7b, 7c and 7d, respectively). These measurements are summarized in Table IV, and are used in a second order interpolation for the 365 nm phase shift (FIG. 8). Good agreement is found between the independent phase shift determinations of this EPS-PMB from matrix modeling the film and PSI tool measurements, demonstrating the validity of the model in understanding the structure, composition and optical properties and performance of the EPS-PMB. The reflectivity of this film, for light incident on the film side of the EPS-PMB and for light incident on the substrate side is shown in FIG. 9 and 10, respectively, and show reflectivities of the EPS-PMB at 365 nm of 0.147 for light incident from the film side, and 0.128 for light incident from the substrate side, demonstrating the ability to control the antireflective properties of the EPS-PMB. The transmission of the EPS-PMB #3700 is 0.217 at the typical inspection wavelength of 488 nm and 0.472 at the alignment wavelength of 633 nm. The etch to clear time of this EPS-PMB is 30 seconds, allowing for traditional wet etching methods on this blank, and the sheet resistance of this EPS-PMB #3700 is $1.2 \times 10^9$ ohms/sq., which is generally suitable for e-beam writing of the blank.

EXAMPLE 2

Figure 11:
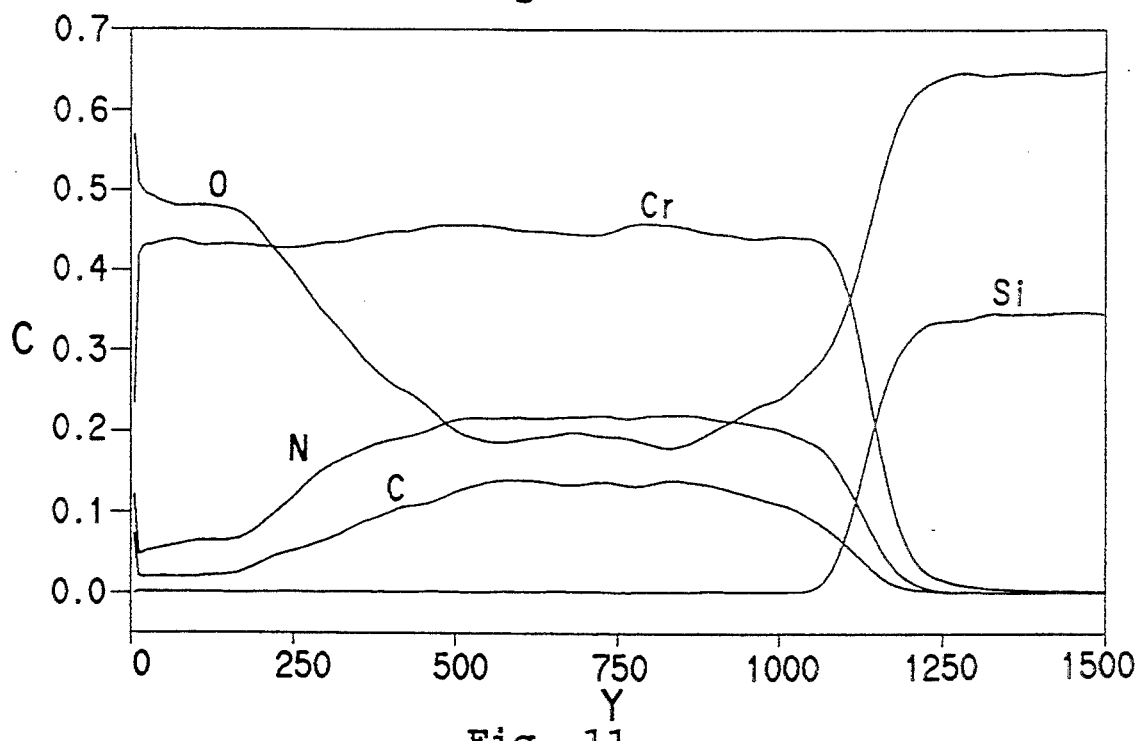
FIG. 11 represents a compositional depth profile of another EPS-PMB provided in accordance with this invention with a chrome chemistry suitable for providing a 6.1% (i.e., 0.061) transmission at 365 nm wavelength, which has an optimized chrome chemistry, with increased carbon, for improved conductivity, and wet etch performance.

This example demonstrates how depth profile engineering permits adjustment of wet etch time and conductivity without dramatically affecting the optical properties of the EPS-PMB. The process parameters summarized in Table I for EPS-PMB #4300 indicate that the major process change relative to EPS-PMB #3700 is the flow rate of $CH_4$. FIG. 11 shows the increased carbon concentration and decreased oxygen concentration of #4300 relative to that of #3700 (FIG. 1). As shown in Table II, this change in the depth profile of the material imparts a wet etch time of 65 sec. to #4300 (as compared to 30 sec. for the #3700), and it imparts a sheet resistance (as measured by the well-known electrometer method) more than fifty times lower in #4300 as compared to #3700).

Figure 12:
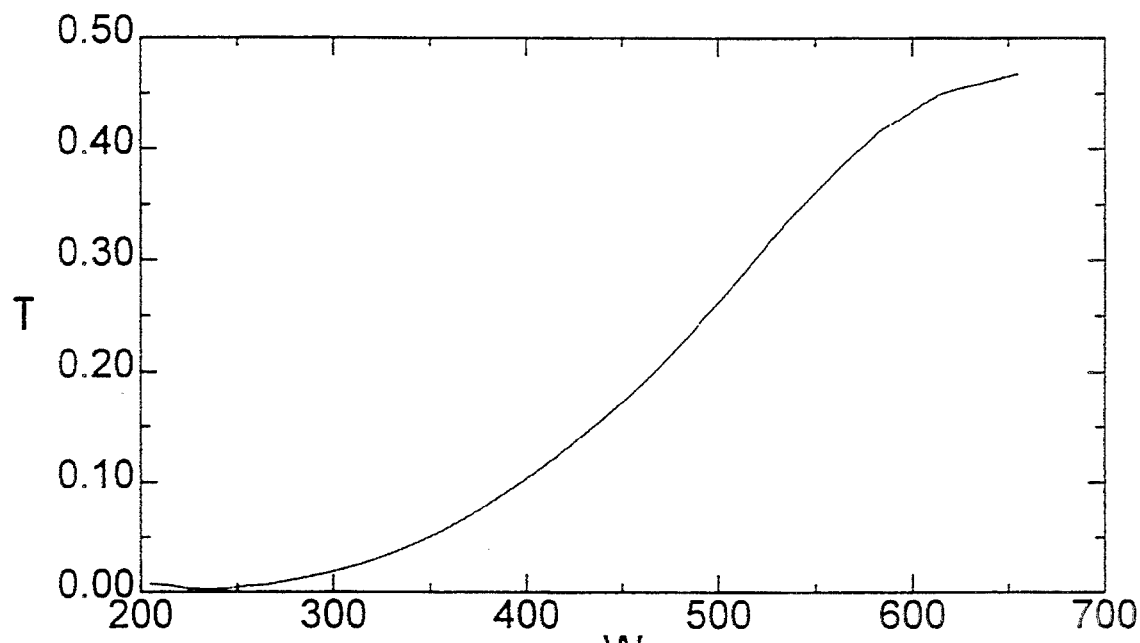
FIG. 12 represents spectral transmission of the EPS-PMB of FIG. 11.
Figure 13:
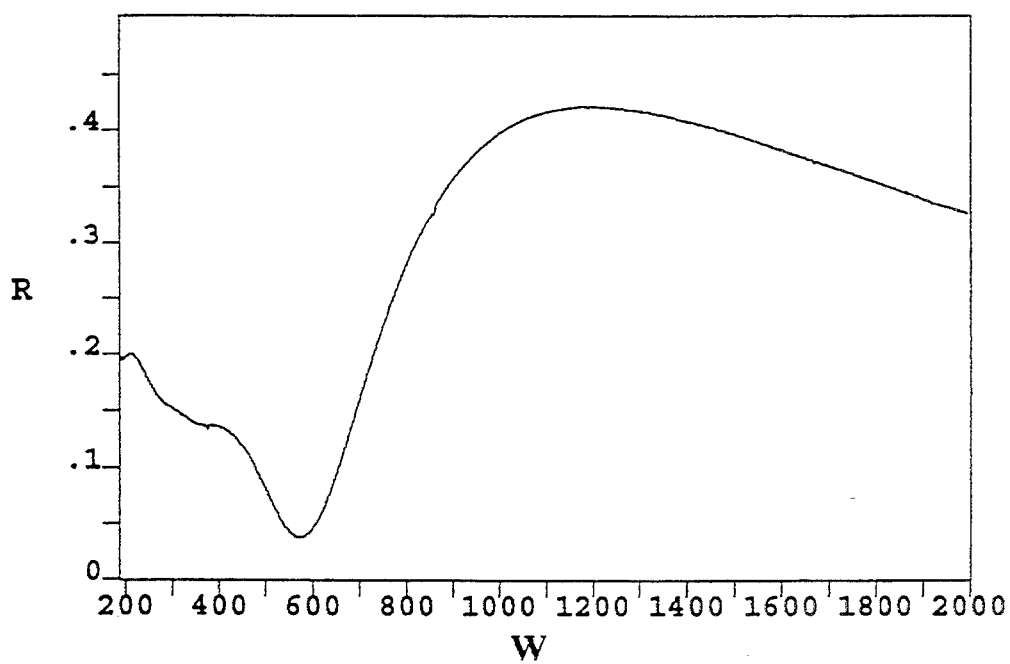
FIG. 13 represents the reflectance for light incident on the film side of the EPS-PMB of FIG. 11.
Figure 14:
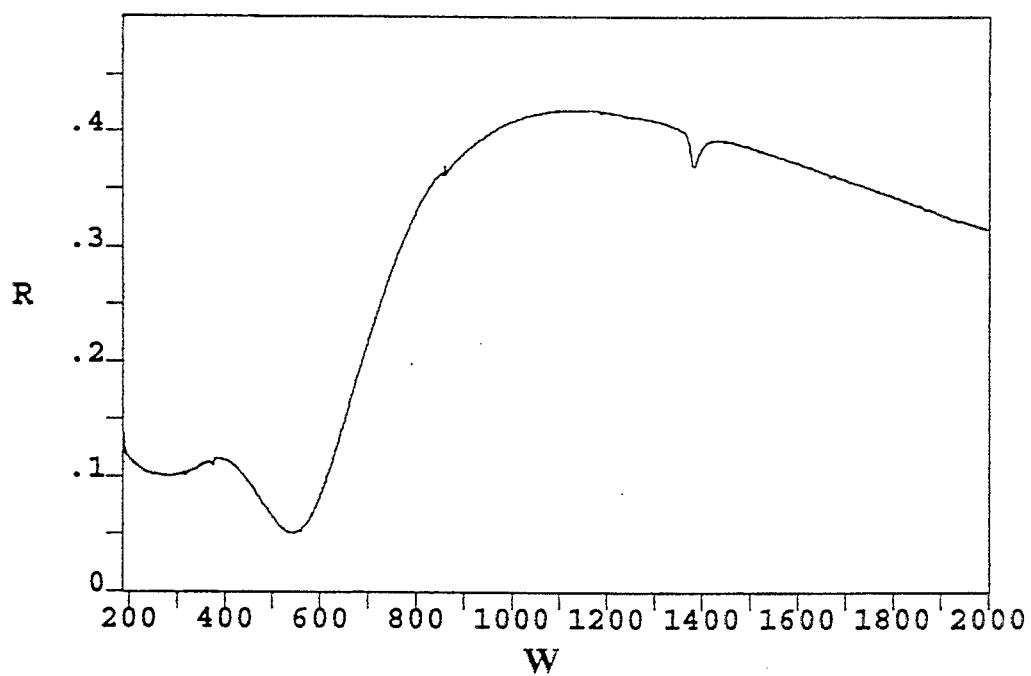
FIG. 14 represents the reflectance for light incident on the substrate side of the EPS-PMB of FIG. 11.
Figure 15A:
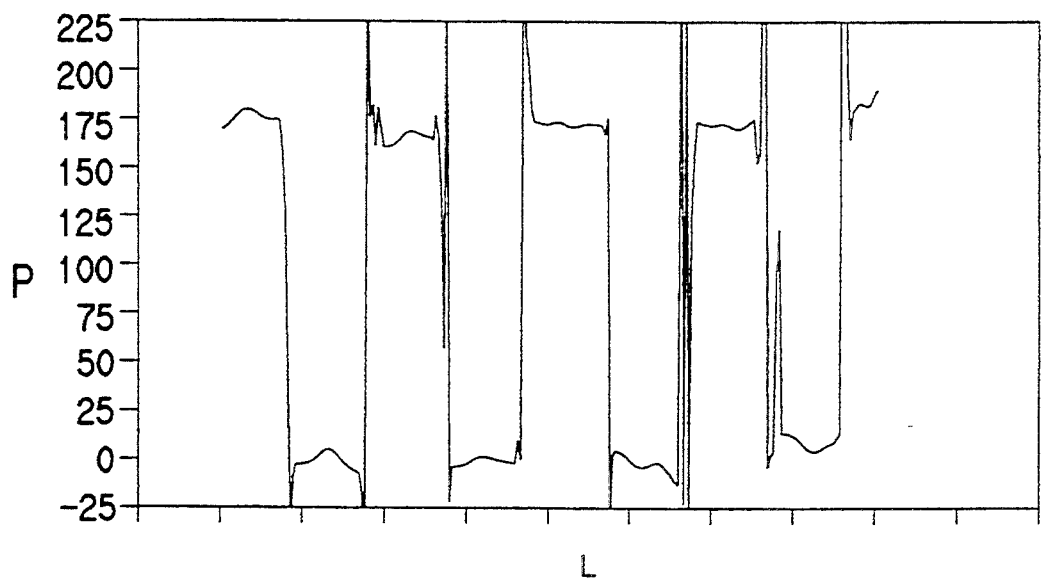
FIGS. 15a, 15b and 15c represent phase sensitive interferometer scans at 325, 488, and 633 nm, respectively, for the EPS-PMB of FIG. 11.
Figure 15B:
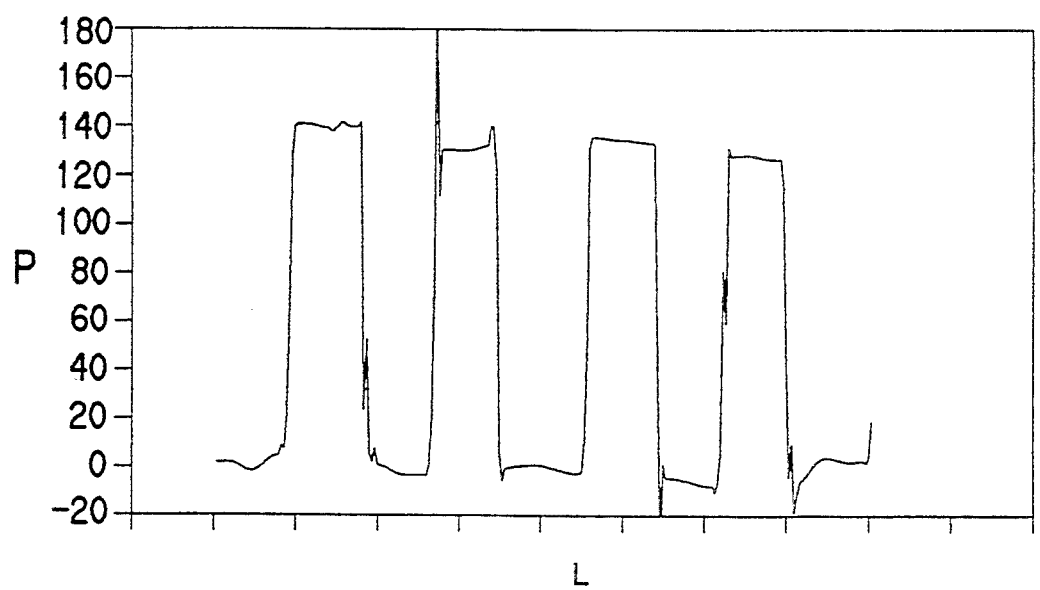
Figure 15C:
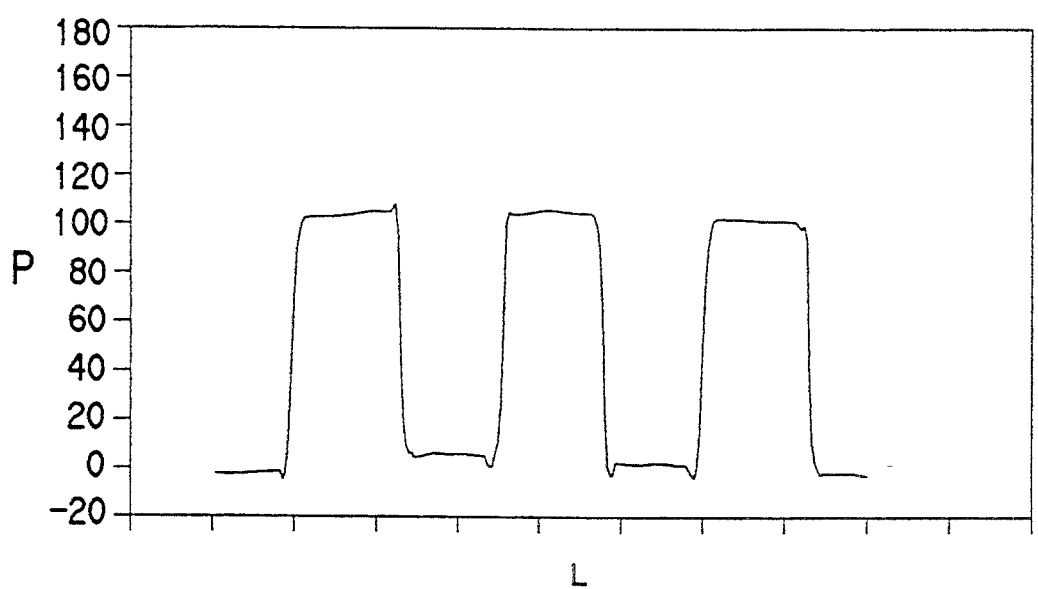
Figure 16:
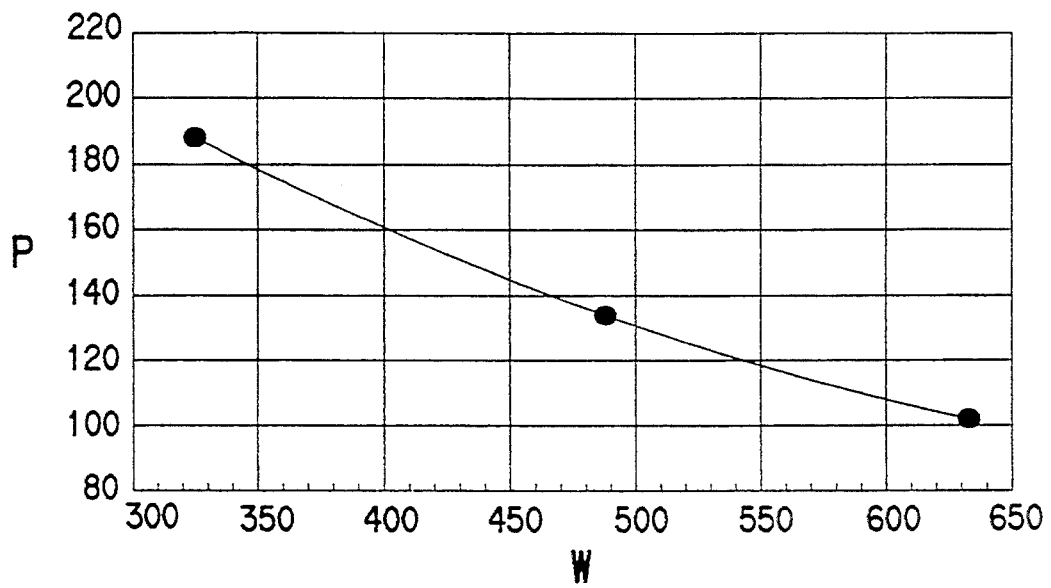
FIG. 16 represents a plot of 325, 488, and 633 nm PSI data for the EPS-PMB of FIG. 11, along with a second-order curve fit to the data (the predicted I-line phase shift is 173° for this EPS-PMB).

The transmission of the EPS-PMB #4300 (FIG. 12), the film-incident reflectance (FIG. 13), the substrate-incident reflectance (FIG. 14), the PSI tool measured phase shifts at 325 nm, 488 nm, and 633 nm (FIG. 15), and the second order fit to the PSI data (FIG. 16) are all similar to the values for the EPS-PMB #3700. If the film thickness of #4300 is increased slightly so that its phase shift at 365 nm is equal to that of #3700, the transmission of #4300 at 365 nm will become about 0.055, which is essentially the same as that of #3700.

EXAMPLE 3

In this example, three sputtering targets are used to adjust the relative thickness and depthwise proportions of the components in the EPS-PMB, permitting flexible design of the film-incident and substrate-incident reflectances of the EPS-PMB. The example illustrates the adjustment of the extinction coefficient of the more strongly absorbing component.

Three chrome targets were used in the reactive sputtering device described in Example 1. Photoblanks were produced with process parameters described in Table I under EPS-PMB samples #4100 and #4200. In both cases, one of the three sputtering targets was operated at a substantially higher power than the other two sputtering targets. The essential difference between the process parameters for the two EPS-PMBs is that target #2 is the high power target for sample #4100 and target

1 is the high power target for sample #4200. Thus, the more strongly absorbing region of the film is in the center of the film for sample #4100, while for sample #4200, the more strongly absorbing region is adjacent to the substrate-film interface. This difference between absorbing region locations is shown in the compositional depth profiles of the two materials (FIG. 17).

Figure 17A:
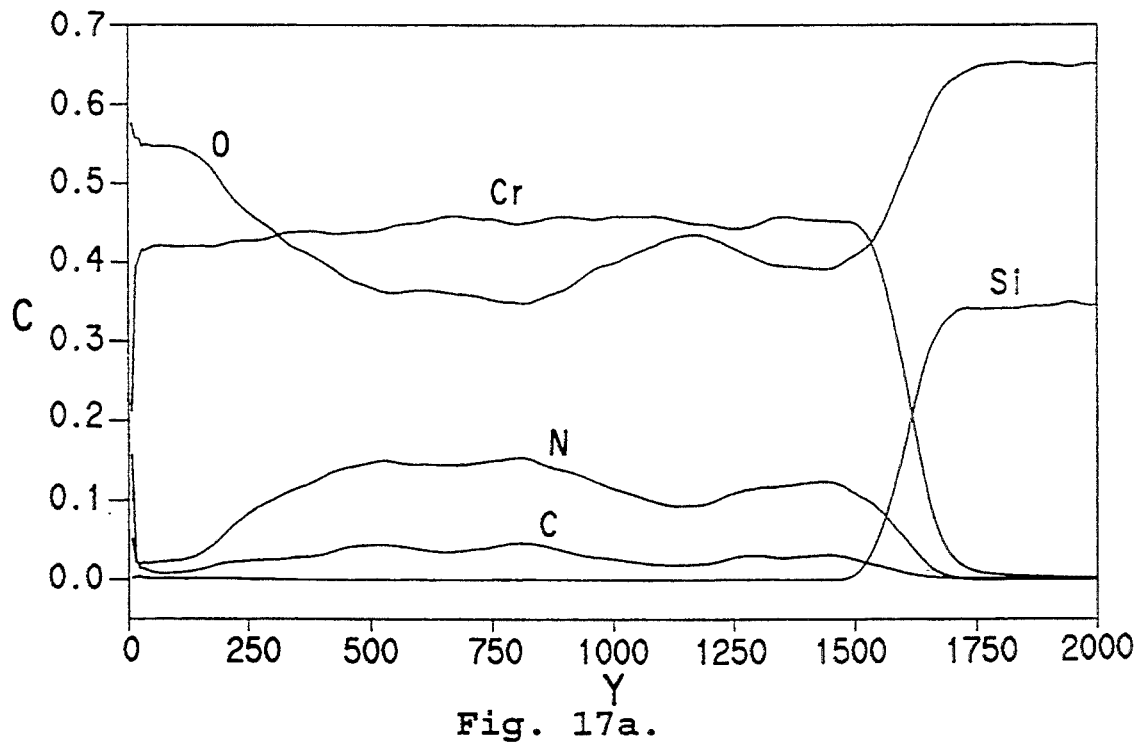
FIGS. 17a and 17b represent compositional depth profiles for two other photomask blanks, the photomask blank of 17a having the more absorbing component in the middle of the film, and the photomask of 17b having the more absorbing component at the base of the film.
Figure 17B:
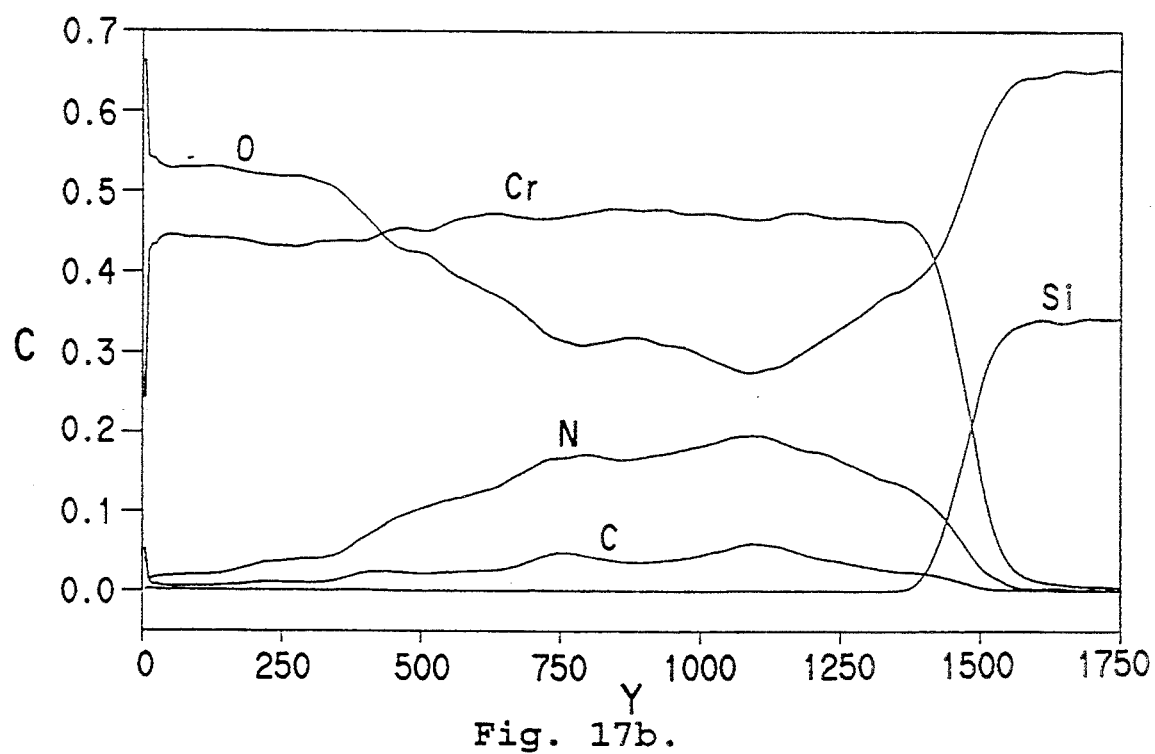
Figure 18A:
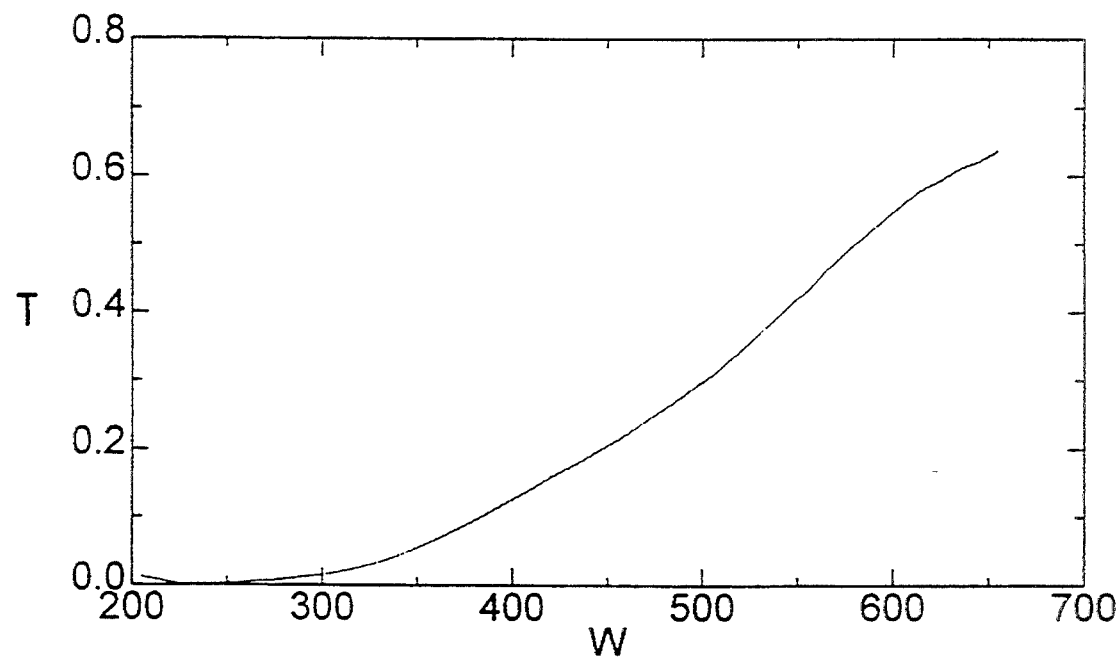
FIGS. 18a and 18b represent spectral transmission of the photomask blanks of FIGS. 17a and 17b, respectively.
Figure 18B:
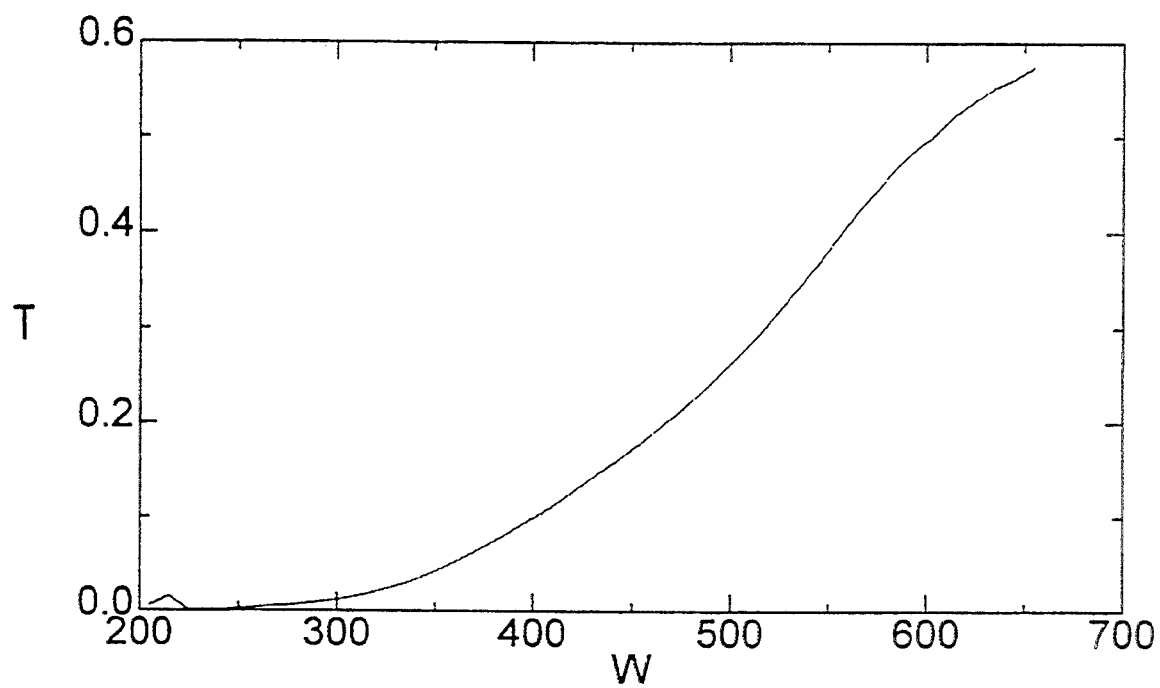

The depth profiles in FIG. 17 illustrate that the more strongly absorbing region of #4200 has less oxygen than the more strongly absorbing region of #4100. Thus, the more absorbing region of #4200 will exhibit a higher extinction coefficient than the more absorbing region of #4100. We define the extent of the more strongly absorbing region of the film by identifying the locations in the film at which the oxygen concentration undergoes half its total change. Thus, in #4100 (FIG. 17a) the oxygen drops from its 0.55 surface concentration to a minimum of 0.35, so the total change in oxygen concentration is 0.20 and half the total change in oxygen concentration is 0.10. The more strongly absorbing region of #4100 is then defined as the region in which the oxygen concentration of the film drops below 0.45 (i.e., 0.55–0.10 is 0.45). This region extends through roughly 75% of #4100's total film thickness. The relative thickness of the more strongly absorbing region of #4200 can be similarly defined, but for #4200 (FIG. 17b) the oxygen concentration drops from about 0.53 in the vicinity of the surface to about 0.27 at its lowest point, and the more strongly absorbing region is defined as the region in which the oxygen concentration drops below 0.40. For sample #4200, the more strongly absorbing region is seen to occupy about 55% of the total film thickness, smaller than the relative thickness of the more strongly absorbing region of #4100. The higher extinction coefficient of #4200's more strongly absorbing region results in a slightly lower transmission than that of #4100, even though the more strongly absorbing region of #4200 occupies a relatively thinner region of the total film thickness. This concentration of a more strongly absorbing region with a higher extinction coefficient also imparts a flatter spectral transmission response to sample #4200 than to #4100, as shown in FIG. 18. Lower transmission is important in inspection and alignment of the photomask produced from the photoblank.

A further difference between #4100 and #4200 is the sheet resistance, as measured by the well known electrometer method. #4200's relatively thinner, less oxidic absorbing region imparts to it a lower sheet resistance than does the relatively thicker, more oxidic absorbing region of #4100, as indicated in Table II. This is advantageous in electron beam patterning of the photoblank because sheet resistance of the material should be low enough that a charge dissipation layer is not required to pattern the film. The desired sheet resistance depends upon the pattern fidelity required, but sheet resistance below about $10^9$ $\Omega/\square$ has been found to be advantageous.

Figure 19A:
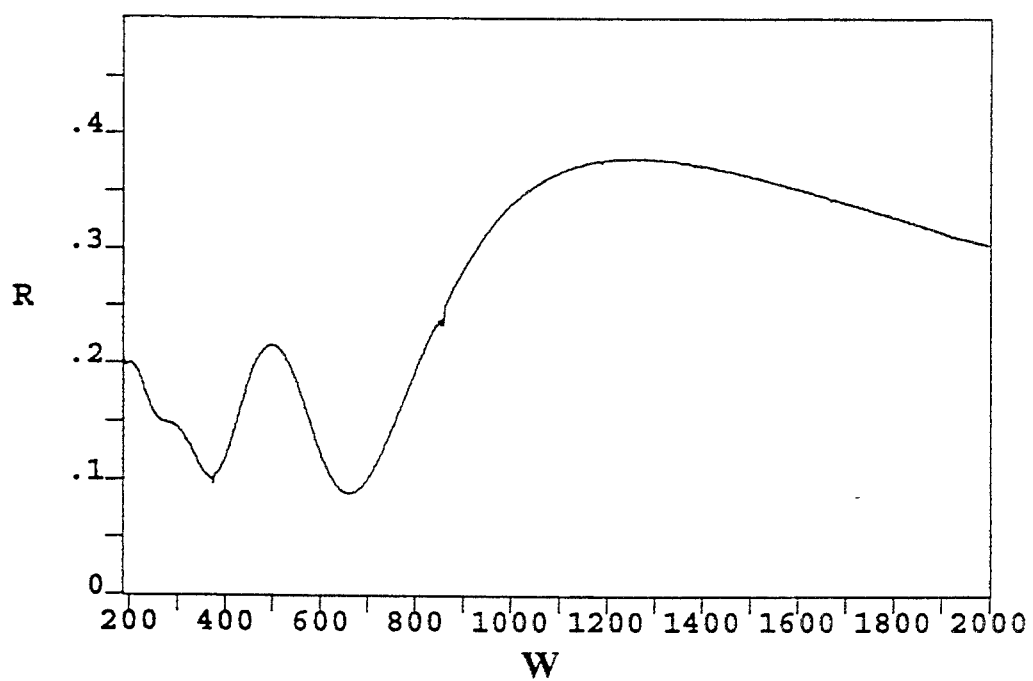
FIGS. 19a and 19b represent the reflectance for light incident on the film side of the photomask blanks of FIGS. 17a and 17b, respectively.
Figure 19B:
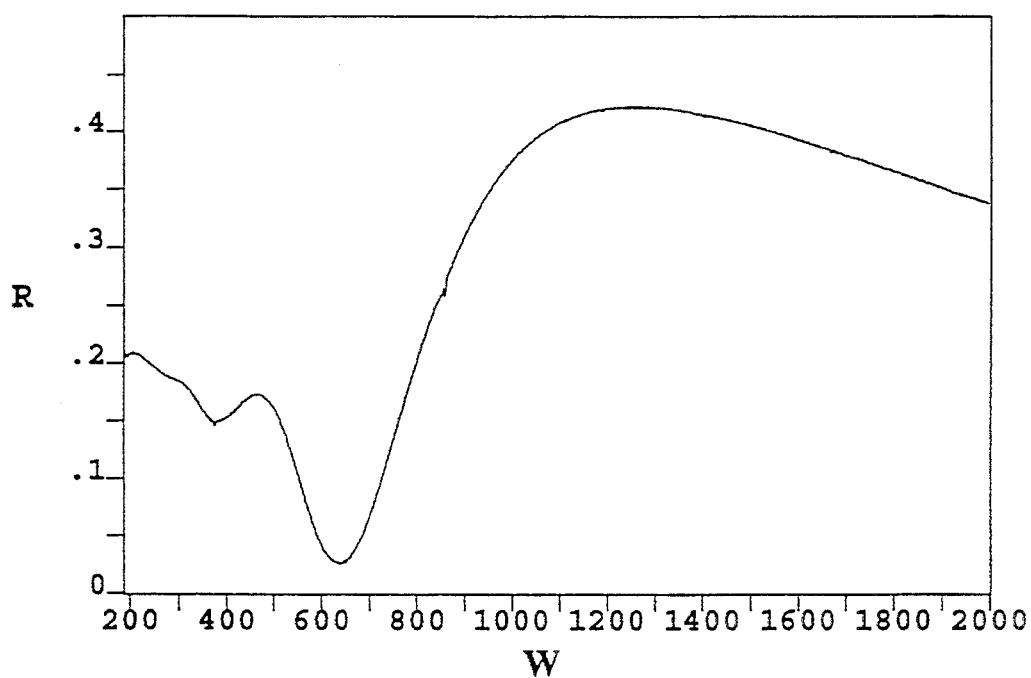
Figure 20A:
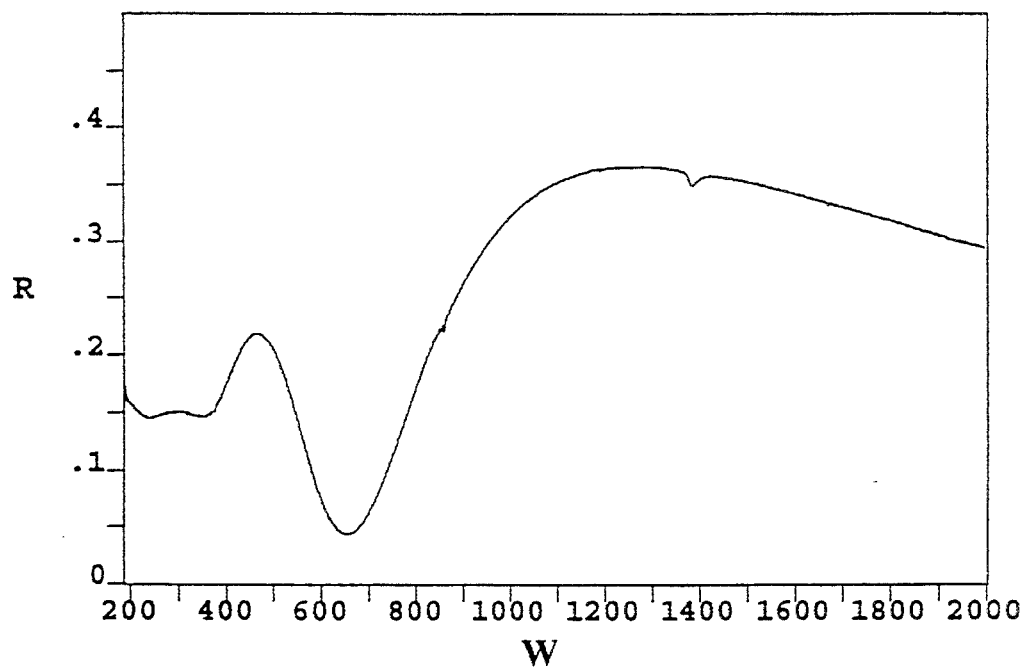
FIGS. 20a and 20b represent reflectance for light incident on the substrate side of the photomask blanks of FIGS. 17a and 17b, respectively.
Figure 20B:
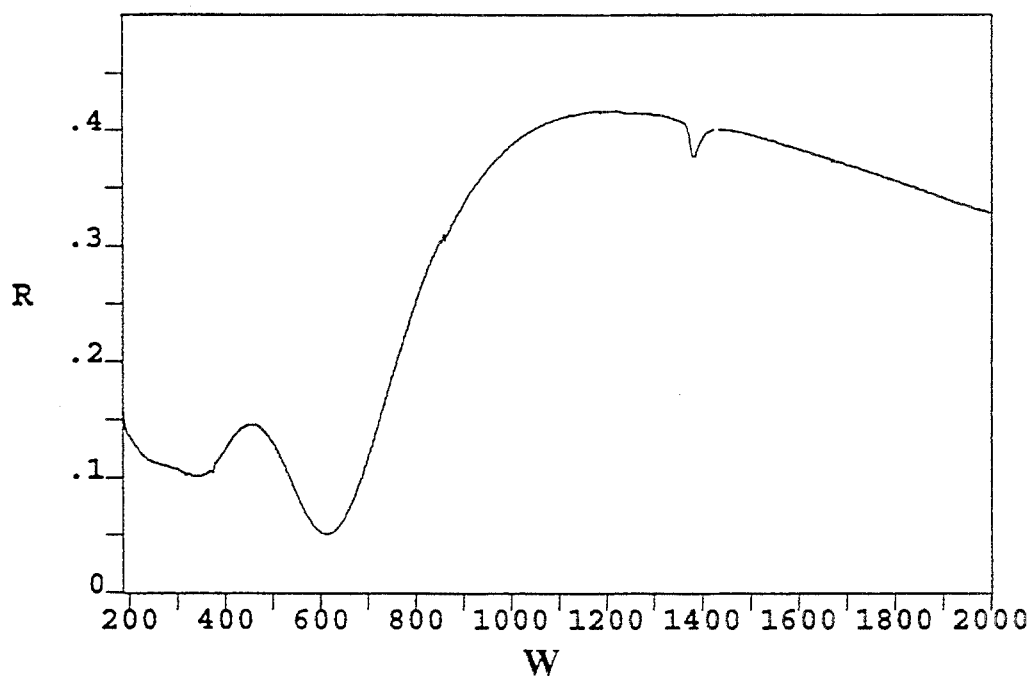
Figure 21A:
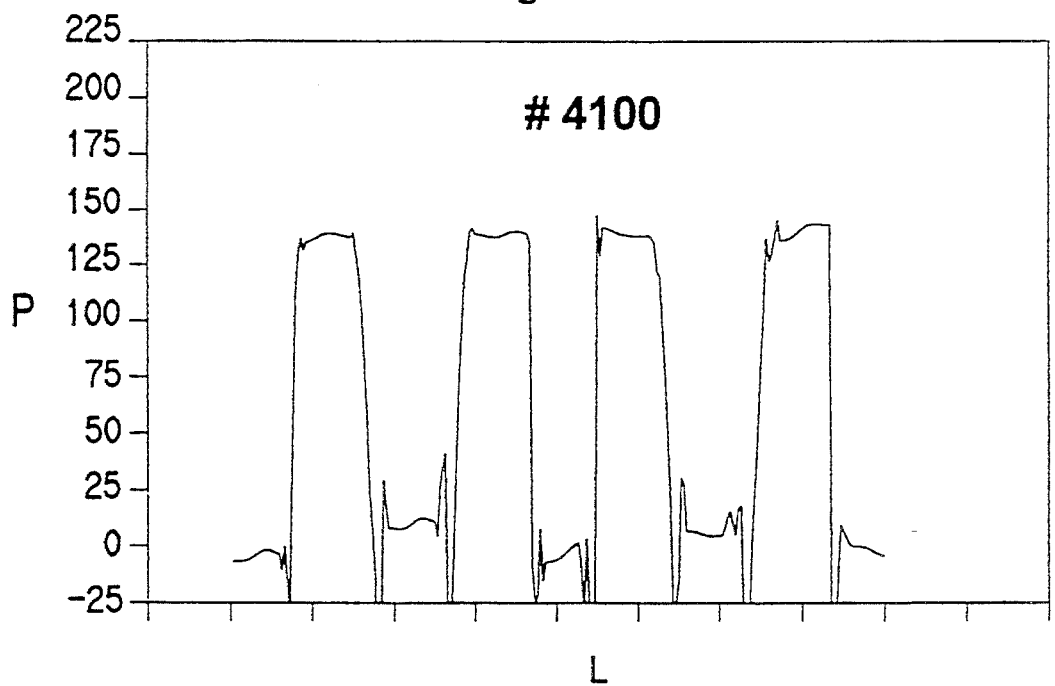
FIGS. 21a, 21b, 21c, 21d, 21e, and 21f represent the phase sensitive interferometer scans for the photomask blanks of FIGS. 17a and 17b at 325 nm, 488 nm, and 633 nm, respectively.
Figure 21B:
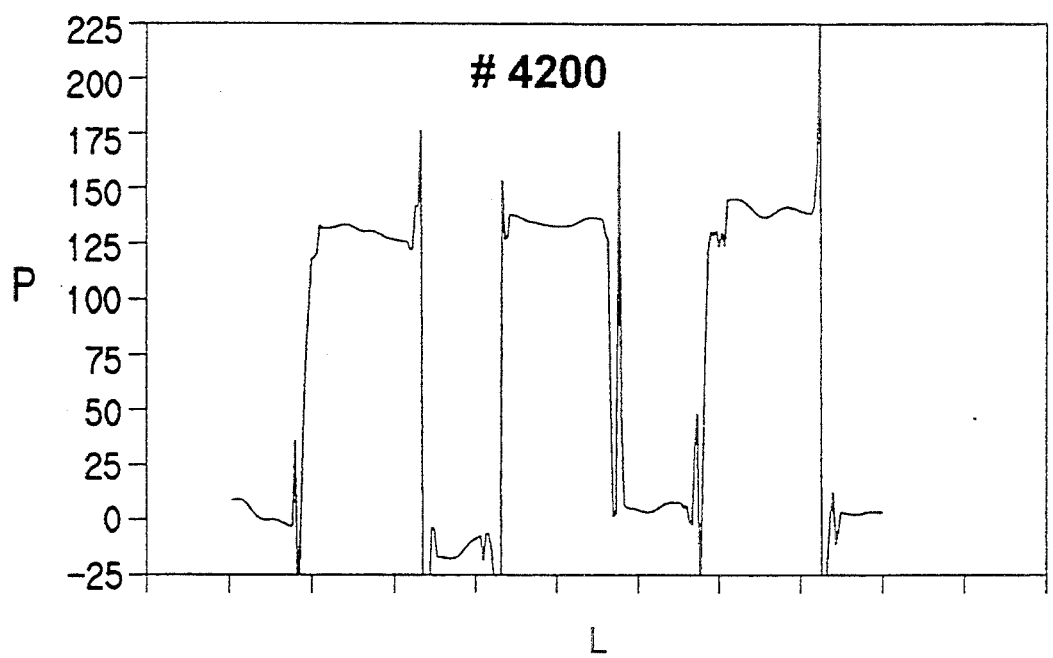
Figure 21C:
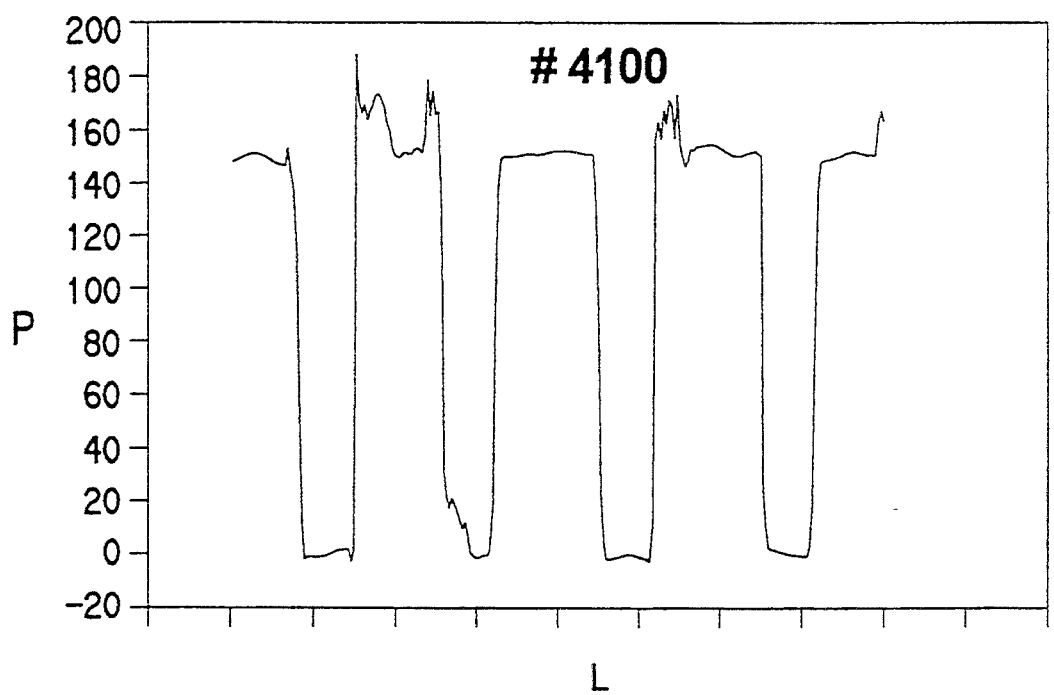
Figure 21D:
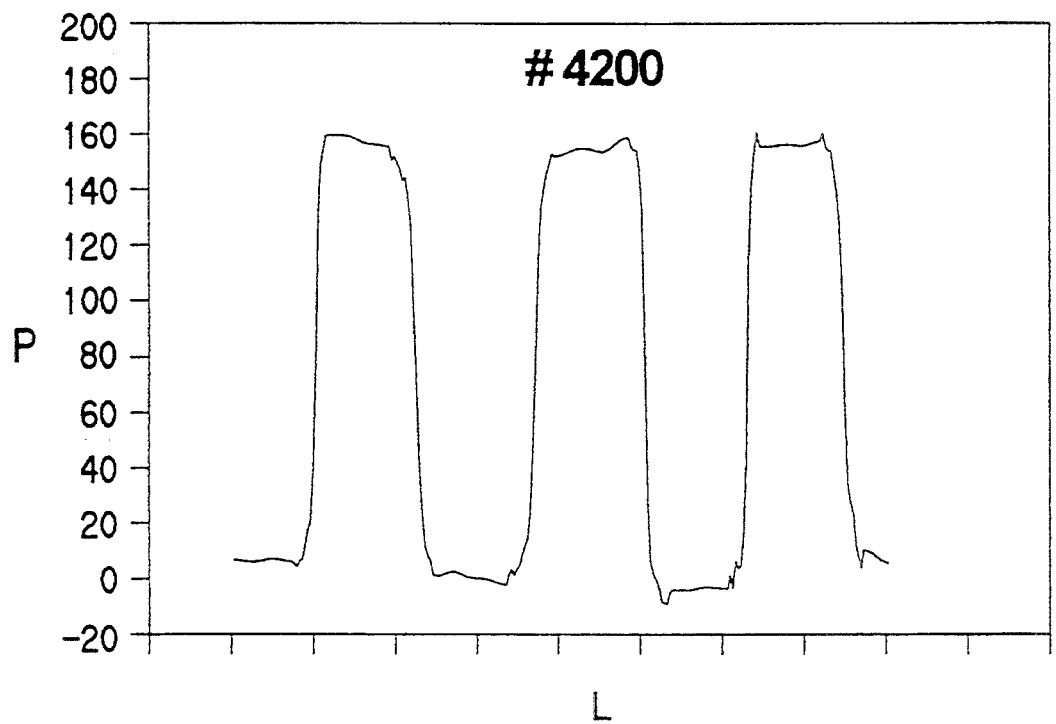
Figure 21E:
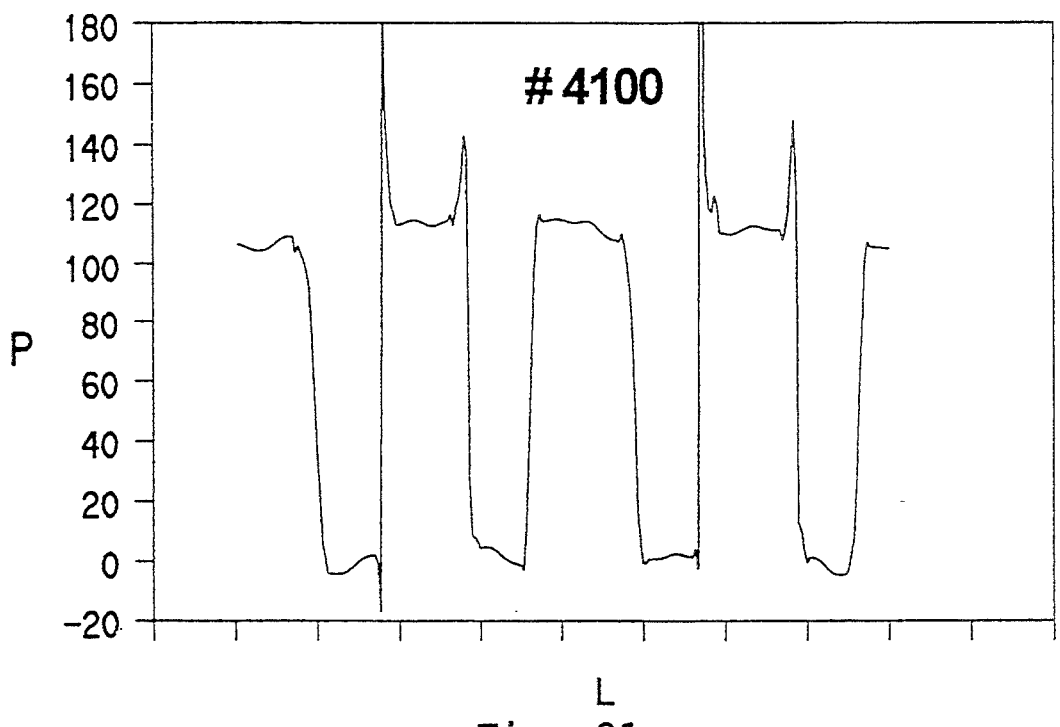
Figure 21F:
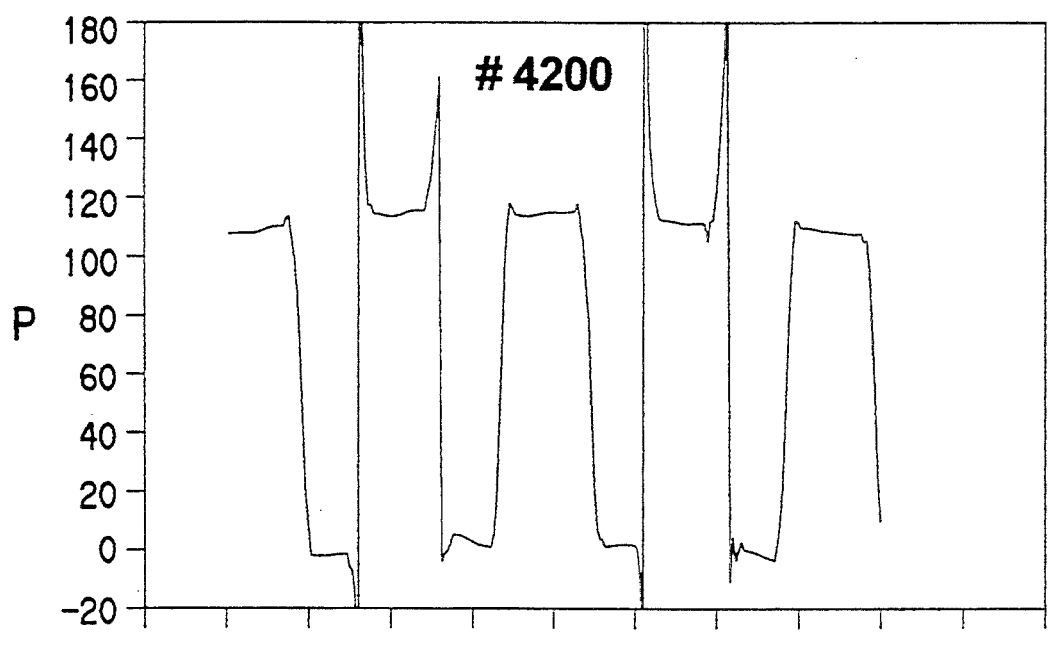

The change in the location of the more strongly absorbing region of the film also results in a change of the film-incident and substrate-incident reflectivities, as shown in FIGS. 19 and 20 and in Table II. Sample #4100 has film-incident reflectance of 0.103 and substrate-incident reflectance of 0.149 at the 365 nm use wavelength, while #4200 has film-incident reflectance of 0.152 and substrate-incident reflectance of 0.104 at the 365 nm use wavelength.

Figure 22A:
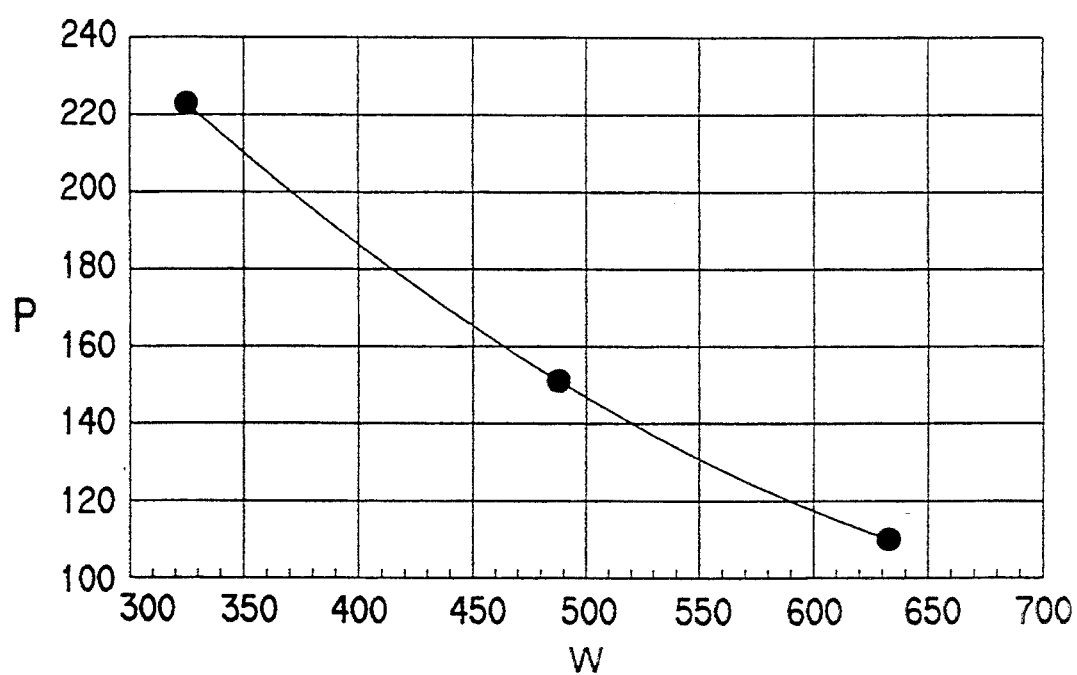
FIGS. 22a and 22b represent a plot of 325, 488, and 633 nm PSI data for the photomask blank of FIGS. 17a and 17b, respectively, along with a second-order curve fit to the data (the predicted I-line phase shift is 203° and 204°, respectively, for these photomask blanks).
Figure 22B:
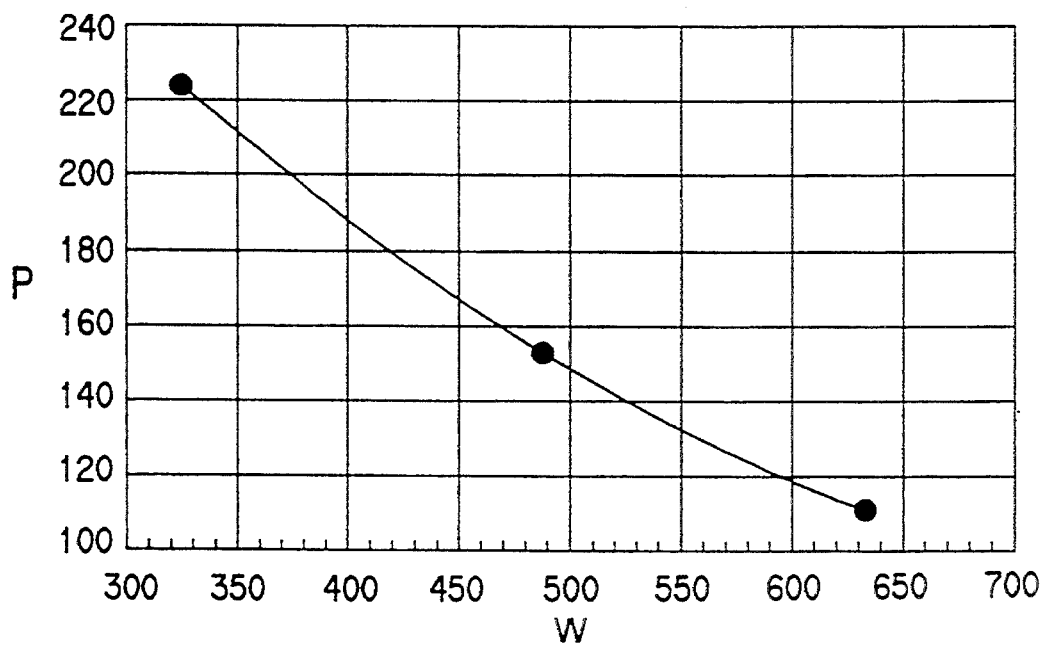

The phase shift measurements for #4100 and #4200 are shown in FIG. 21, and the second order fits to the FIG. 21 data are shown in FIG. 22. These data and the data in Table II indicate the phase shifts at the 365 nm use wavelength to be 203° for #4100 and 204° for #4200. The depth profile engineering in this example thus allows adjustment of the transmission, sheet resistance, and reflectances of the material, even though the phase shift is essentially unaffected at the 365 nm use wavelength.

EXAMPLE 4

Figure 23:
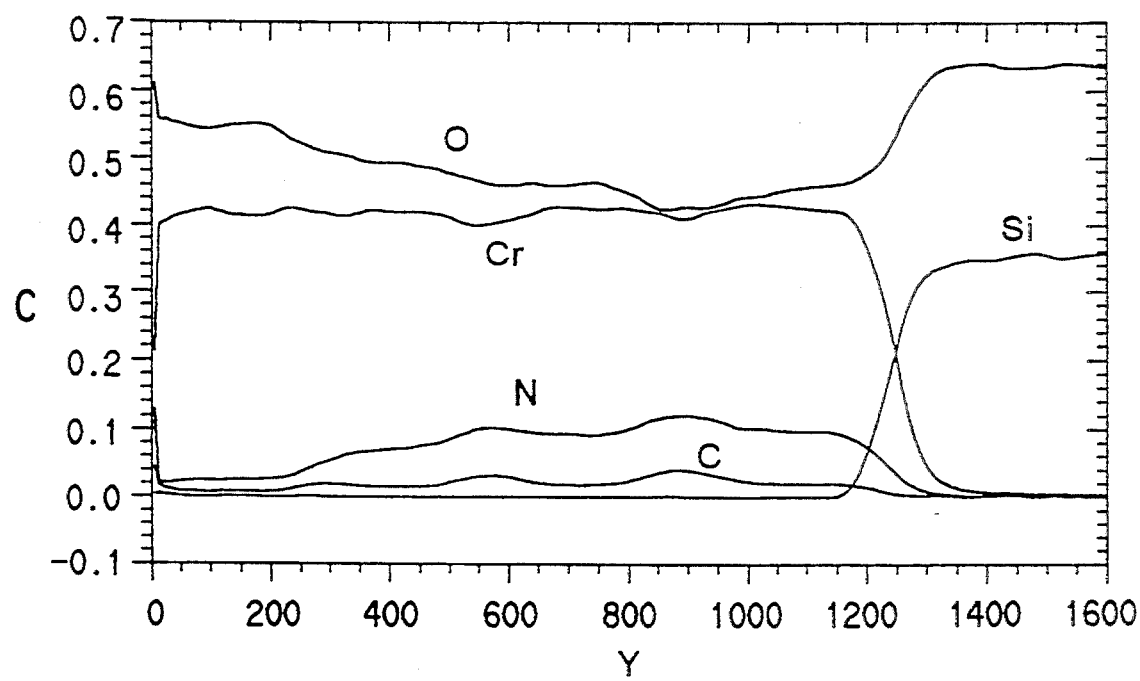
FIG. 23 represents a compositional depth profile for another photomask blank with a chrome chemistry suitable for a 2.3% transmission at 248 nm (DUV).
Figure 24:
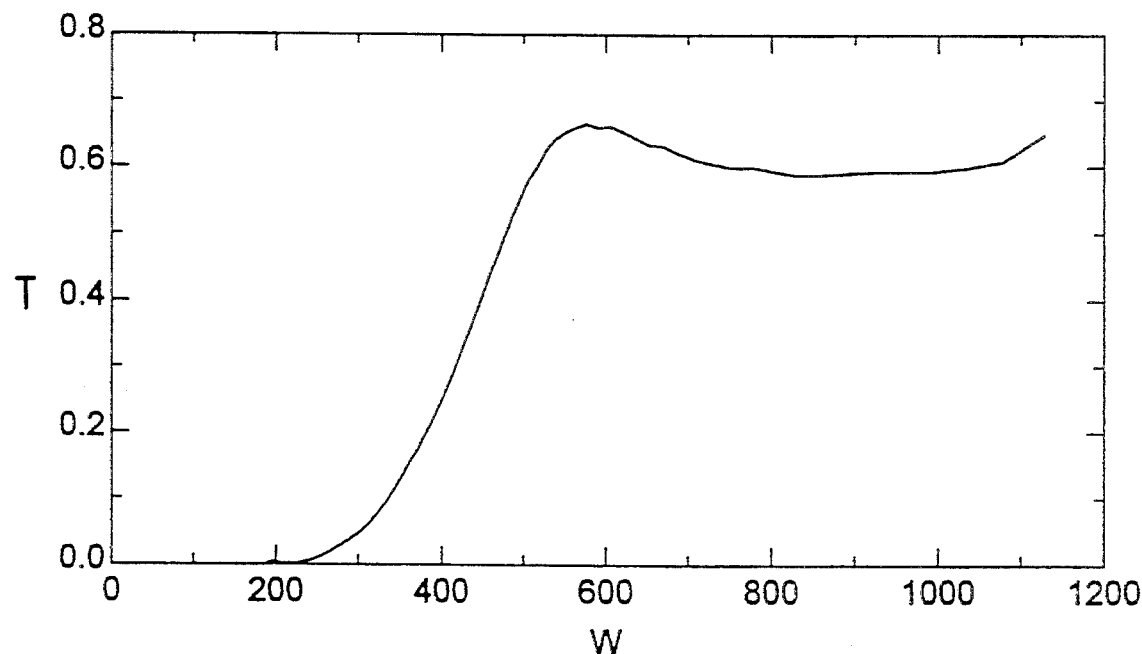
FIG. 24 represents the transmission of the photomask blank of FIG. 23.
Figure 25:
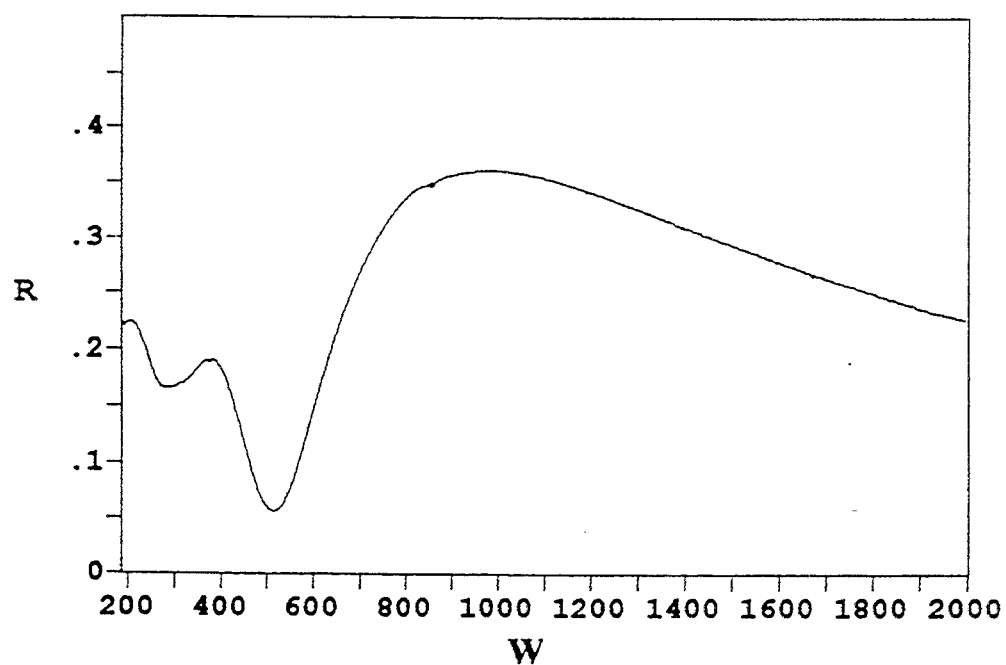
FIG. 25 represents the reflectance for light incident on the film side of the photomask blank of FIG. 23.
Figure 26:
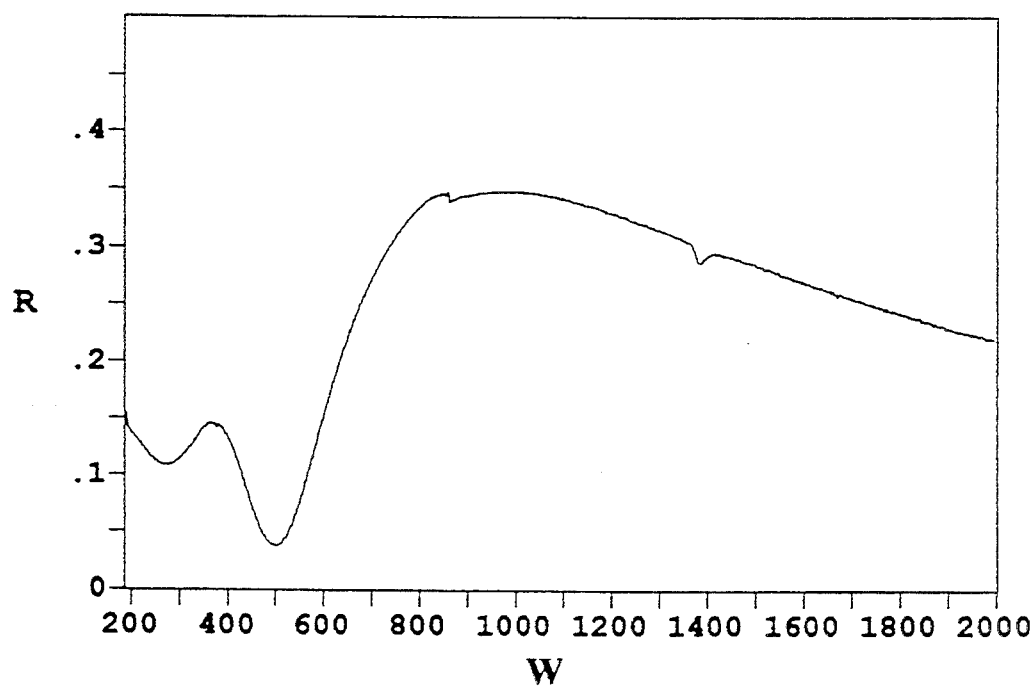
FIG. 26 represents the reflectance for light incident on the substrate side of the photomask blank of FIG. 23.
Figure 27A:
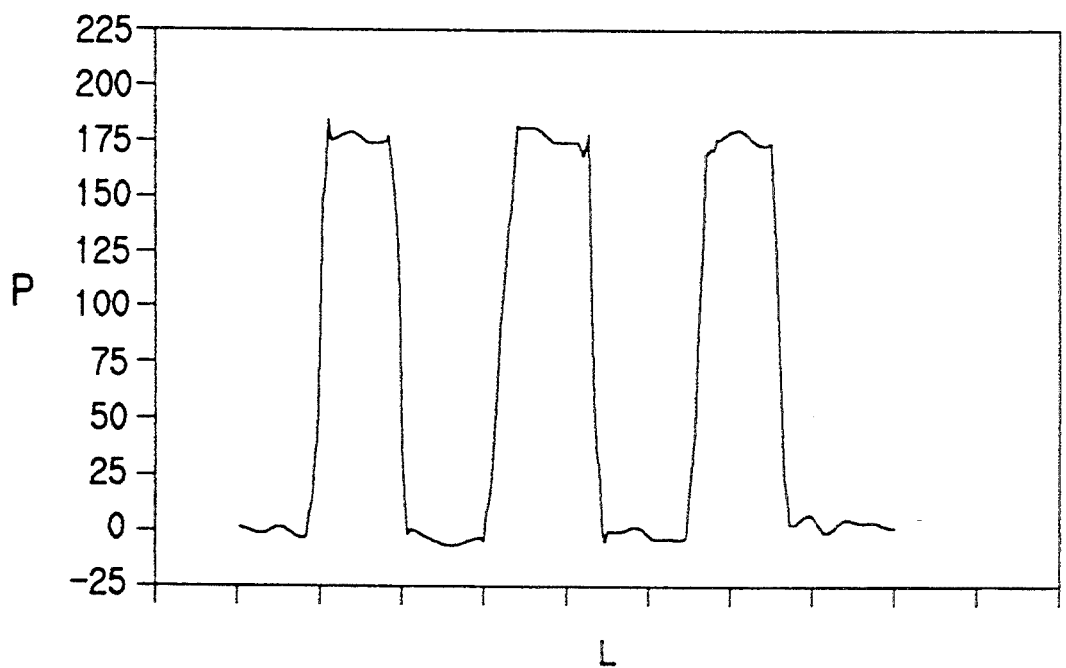
FIGS. 27a, 27b and 27c represent phase sensitive interferometer scans at 325, 488, and 633 nm, respectively, for the photomask blank of FIG. 23.
Figure 27B:
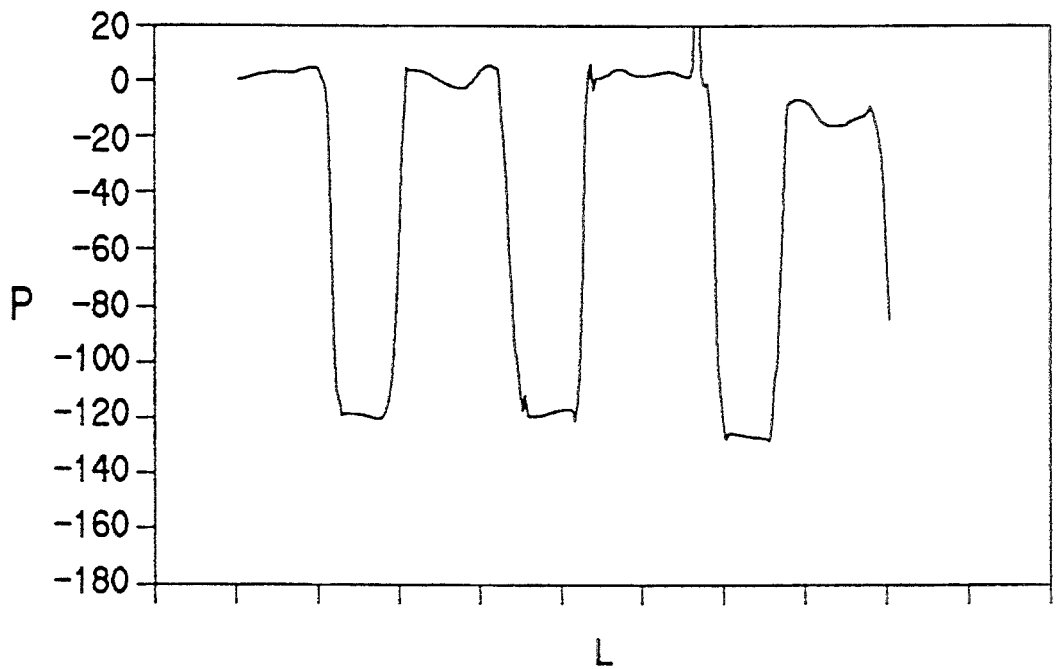
Figure 27C:
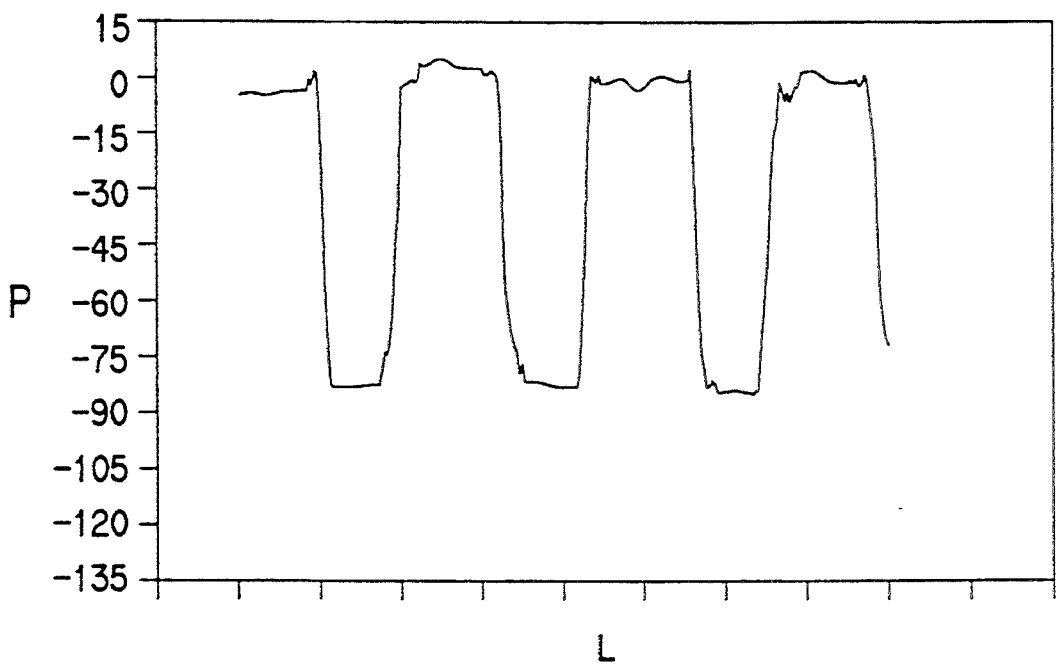
Figure 28:
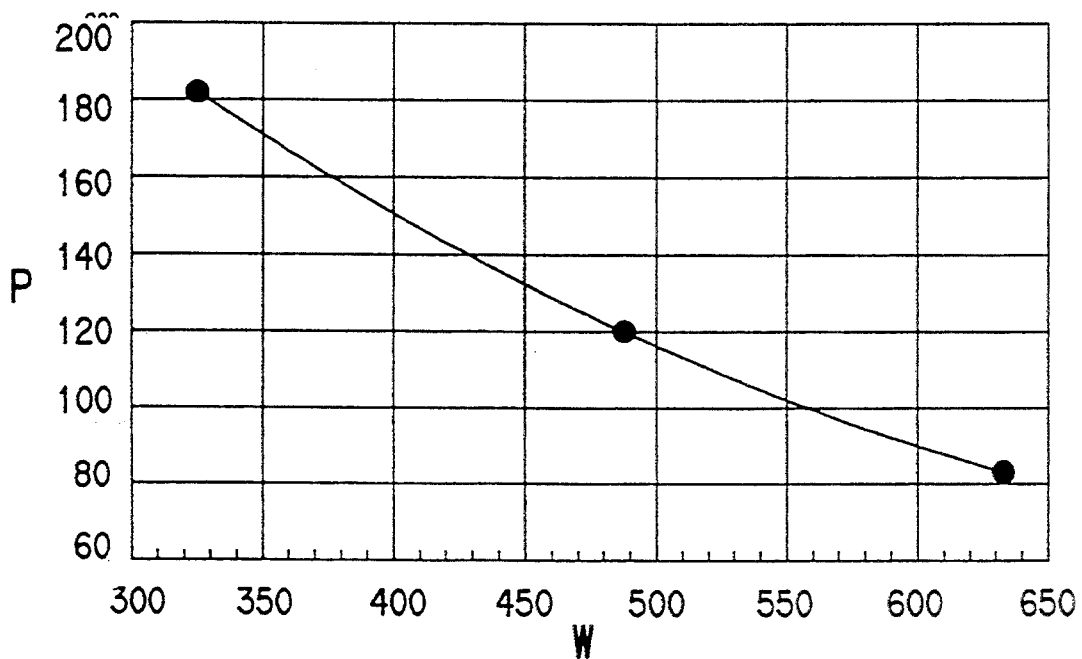
FIG. 28 represents a plot of 325, 488, and 633 nm PSI data for the photomask blank of FIG. 23 along with a second-order curve fit to the data (the predicted DUV phase shift is 219° for this photomask blank).

This example illustrates the production of EPS-PMBs for use at wavelengths other than I-line (365 nm). An attenuated blank (#3900) was produced using the process setting presented in Table I for #3900, and has the composition profile shown in FIG. 23. It has a transmission (FIG. 24) and film and substrate-incident reflectances (FIG. 25 and FIG. 26) which when combined with the large DUV phase shift of this film (as determined from the PSI scans of FIG. 27 and the second-order fit of FIG. 28) permit one to produce a DUV EPS-PMB having 2.3% transmission at the lithographic wavelength from this material. This is accomplished by producing a film of 907 nm thickness to provide the 2.3% DUV EPS-PMB, using the component materials and relative depth profiles of FIG. 23.

EXAMPLE 5

Figure 29:
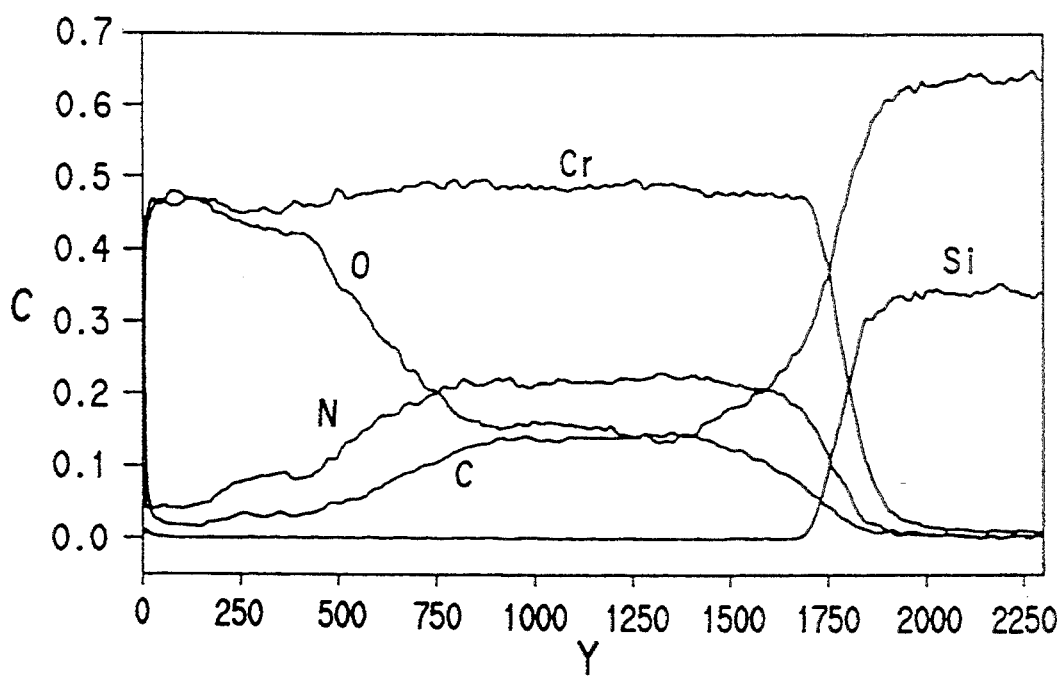
FIG. 29 represents a compositional depth profile of another EPS-PMB provided in accordance with this invention with a chrome chemistry suitable for providing a 6.3% G-line Transmission.
Figure 30:
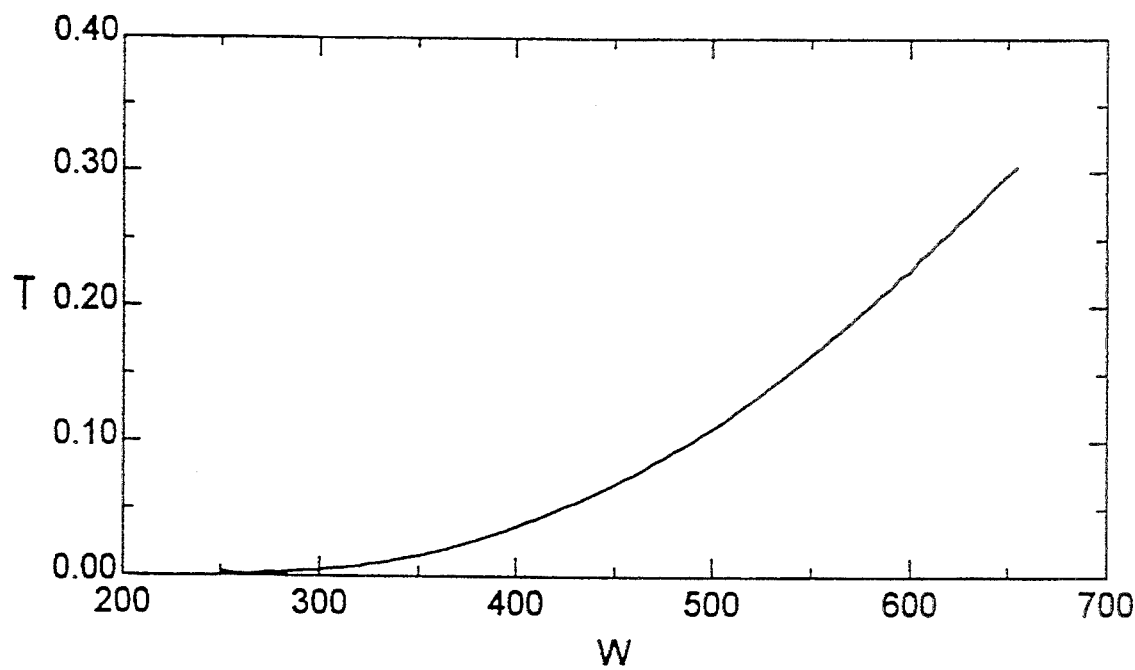
FIG. 30 represents a spectral transmission of the EPS-PMB of FIG. 29.
Figure 31:
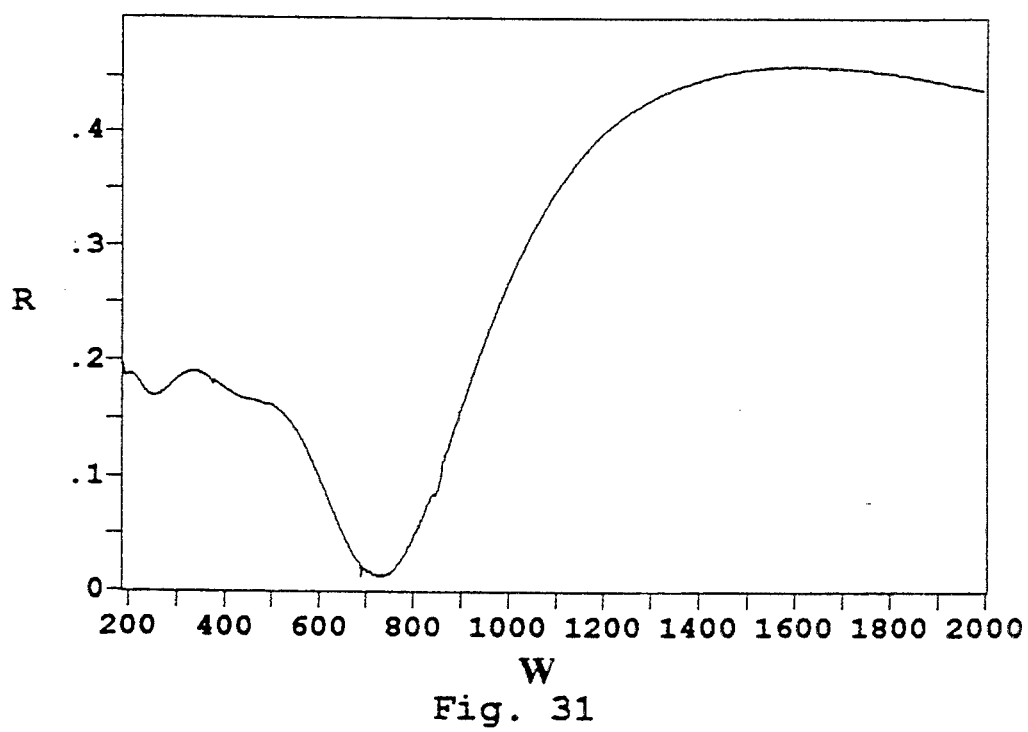
FIG. 31 represents the reflectance for light incident on the film side of the EPS-PMB of FIG. 29.
Figure 32:
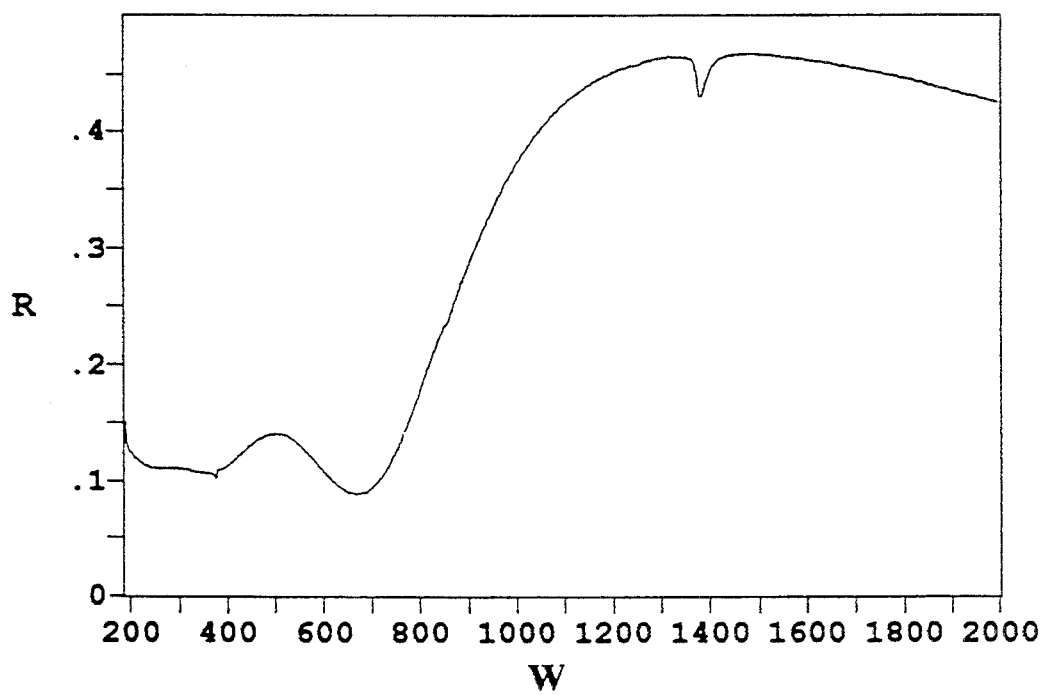
FIG. 32 represents the reflectance for light incident on the substrate side of the EPS-PMB of FIG. 29.
Figure 33A:
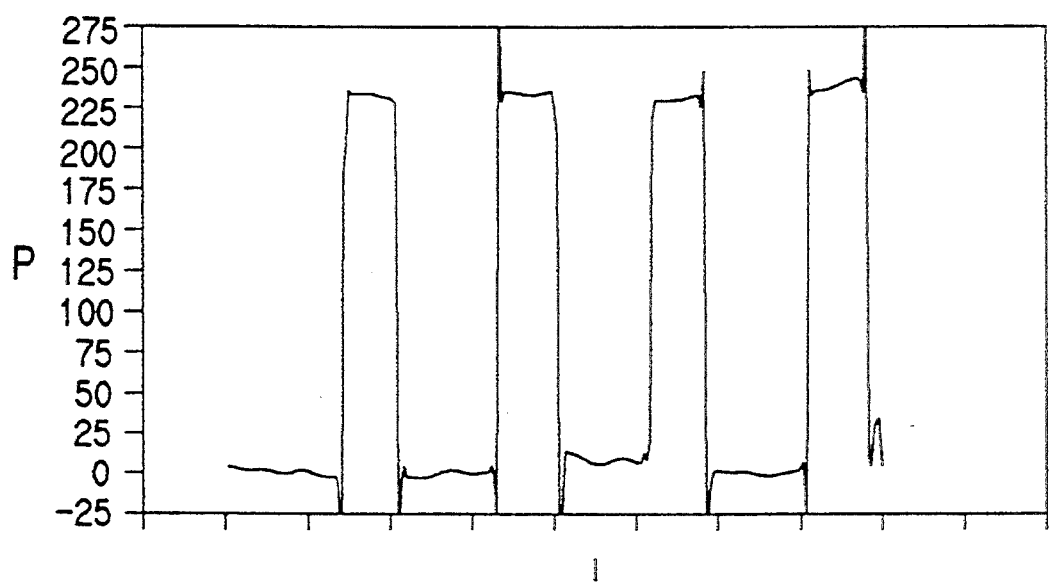
FIGS. 33a, 33b and 33c represent phase sensitive interferometer scans at 325, 488, and 633 nm, respectively, for the EPS-PMB of FIG. 29.
Figure 33B:
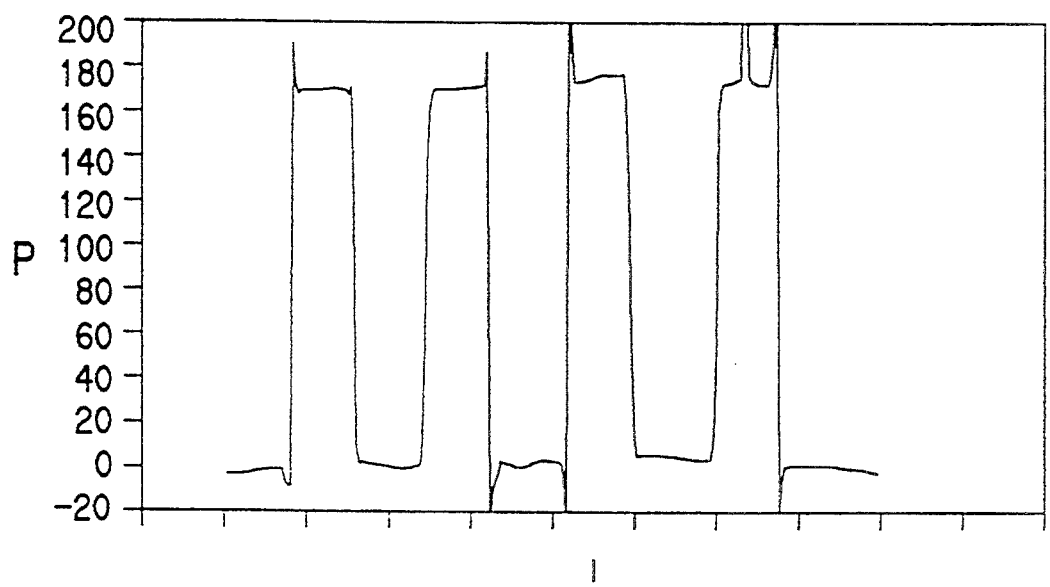
Figure 33C:
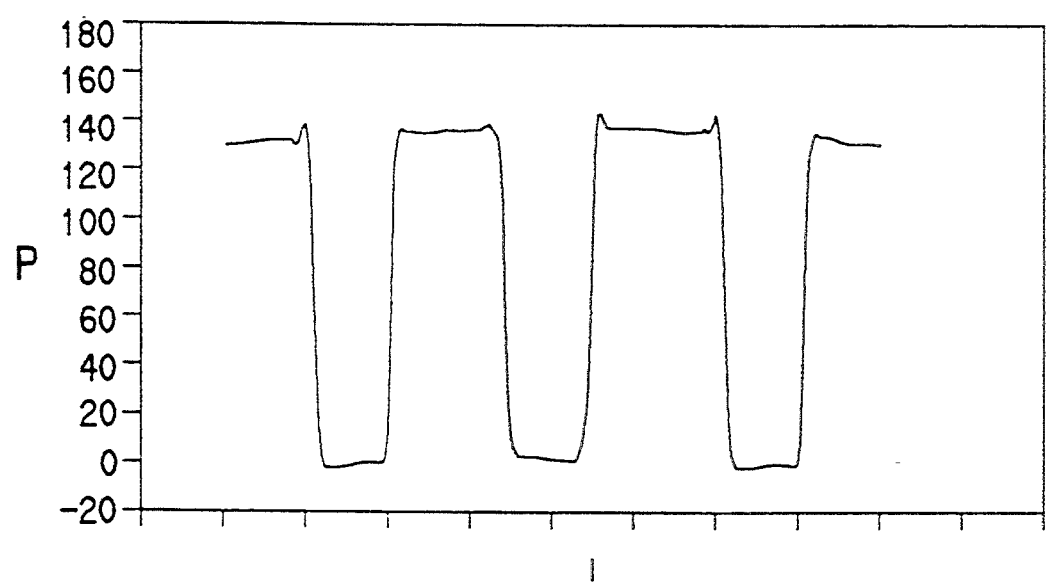
Figure 34:
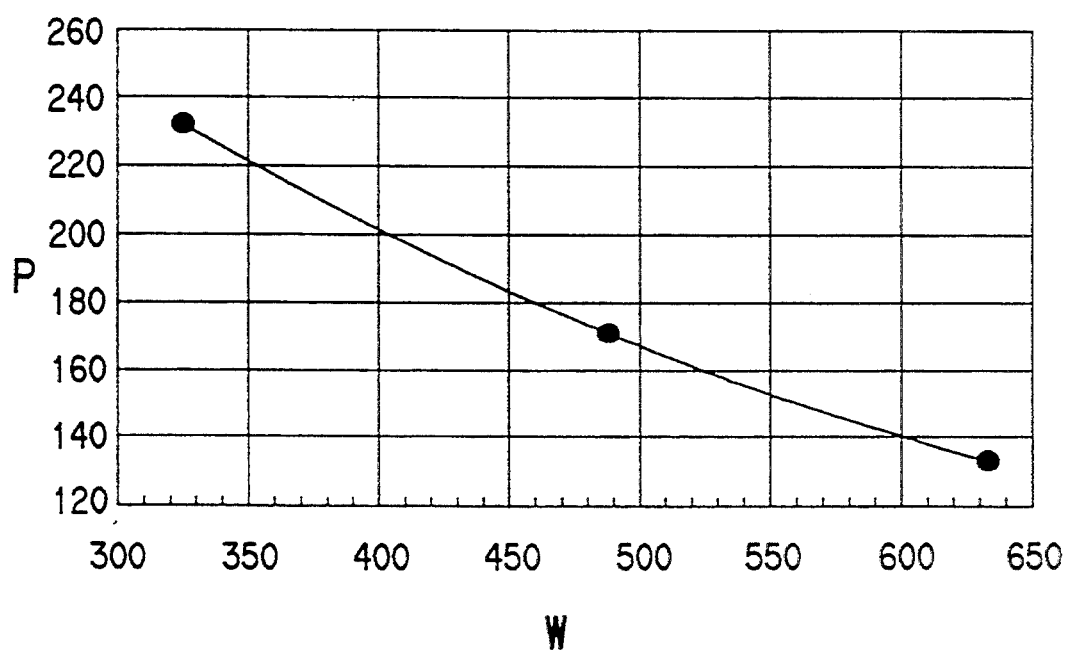
FIG. 34 represents a plot of 325, 488, and 633 nm PSI data for the EPS-PMB of FIG. 29 along with a second-order curve fit to the data (the predicted G-line phase shift is 188° for this EPS-PMB).

The principles presented herein can also be used to produce EPS-PMBs for use at wavelengths other than I-line (365 nm). An attenuated blank (#5000) for use at G-line (436 nm) was produced using the process settings presented in Table I for #5000, and has the composition profile shown in FIG. 29. It has a transmission (FIG. 30) and film and substrate-incident reflectances (as determined from the PSI scan of FIG. 31 and the second-order fit of FIG. 32) which when combined with the G-line phase shift of this film (FIG. 33 and FIG. 34) demonstrates that this is a 6.3% G-line EPS-PMB having 6.3% transmission at the lithographic wavelength.

Example 1, Example 2, Example 3, Example 4 and Example 5 demonstrate the inherent advantages of the inhomogeneous nature of these films and the versatility of the higher absorbing and less absorbing components of the inhomogeneous attenuating films.

TABLE I

| Parameter | Units | Process Parameters | | | | | |
| --- | --- | --- | --- | --- | --- | --- | --- |
| | | #3700 | #4300 | #4100 | #4200 | #3900 | #5000 |
| Operating Pressure | $10^{-3}$ Torr | 3.21 | 3.25 | 3.21 | 3.47 | 3.45 | 3.39 |
| Substrate Travel Speed | mm/min. | 150 | 150 | 150 | 150 | 150 | 150 |
| DC Elec. Power: Target #1 | KW | 0 | 0 | 0 | 0.82 | 0 | 1.67 |
| DC Elec. Power: Target #2 | KW | 1.66 | 1.68 | 1.68 | 0.85 | 2.23 | 0.86 |
| DC Elec. Power: Target #3 | KW | 0.85 | 0.86 | 0.86 | 0.86 | 1.22 | 0.87 |
| Ar | sccm | 89 | 89 | 89 | 89 | 89 | 89 |
| $O_2$ | sccm | 7 | 7 | 9 | 9 | 10.25 | 9 |
| $N_2$ | sccm | 24 | 24 | 24 | 24 | 24 | 24 |

TABLE I-continued

| Parameter | Units | Process Parameters | | | | | |
|---|---|---|---|---|---|---|---|
| | | #3700 | #4300 | #4100 | #4200 | #3900 | #5000 |
| $CH_4$ | sccm | 3.75 | 15 | 3.75 | 3.75 | 3.75 | 15 |
| $CO_2$ | sccm | 5.4 | 5.4 | 6.9 | 6.9 | 7.9 | 6.9 |

TABLE II

| Property | Units | Attenuated Photomask Blank Properties | | | | | |
|---|---|---|---|---|---|---|---|
| | | #3700 | #4300 | #4100 | #4200 | #3900 | #5000 |
| Actual Transmission | Absolute, Relative to Air | 0.054 (365 nm) | 0.061 (365 nm) | 0.072 (365 nm) | 0.054 (365 nm) | 0.010 (248 nm) | 0.063 (436 nm) |
| Phase Shift (calculated) | Absolute, (PSI Tool Fit) | 179° (365 nm) | 173° (365 nm) | 203° (365 nm) | 204° (365 nm) | 219° (248 nm) | 188° (436 nm) |
| Reflectance (Film Incid.) | Absolute, Relative to Air | .147 (365 nm) | .137 (365 nm) | .103 (365 nm) | .152 (365 nm) | .190 (248 nm) | .168 (436 nm) |
| Reflectance (Substrate Incid.) | Absolute, Relative to Air | .128 (365 nm) | .112 (365 nm) | .149 (365 nm) | .104 (365 nm) | .114 (248 nm) | .125 (436 nm) |
| 488 nm Inspection Transmission | Absolute, Relative to Air | 0.217 | 0.236 | 0.278 | 0.208 | 0.520 | 0.10 |
| 633 nm Alignment Transmission | Absolute, Relative to Air | 0.472 | 0.464 | 0.623 | 0.521 | 0.652 | 0.28 |
| Film Thickness | nm | 111.8 | 122.6 | 138.4 | 131.3 | 110.4 | 146.3 |
| Etch to Clear Time | Seconds | 30 | 65 | 35 | 35 | 25 | 110 |
| Sheet Resistance | Ohms/Sq. | $1.2 \times 10^9$ | $2.2 \times 10^7$ | $3.3 \times 10^{10}$ | $8.7 \times 10^8$ | $3.9 \times 10^{11}$ | $5 \times 10^5$ |
| EPS-PMB Phase Shift | Absolute, Relative to Air | 179° I-line | 173° I-line | 180° I-line Prototype | 180° I-line Prototype | 180° DUV Prototype | 188° G-line |
| EPS-PMB Transmission | Absolute, Relative to Air | 0.054 (365 nm) | 0.061 (365 nm) | 0.097 (365 nm) | 0.076 (365 nm) | 0.023 (248 nm) | 0.063 (436 nm) |
| EPS-PMB Thickness | nm | | | 122.7 | 115.9 | 90.7 | |

TABLE III

| Material's Optical Properties of EPS-PMB #3700 | | | | | | | |
|---|---|---|---|---|---|---|---|
| Values at 365 nm Wavelength | Relative Position | % Mat. 1 | % Mat. 2 | n | k | $\epsilon_1$ | $\epsilon_2$ |
| Component Material 1 | — | 100 | 0 | 2.85 | 0.89 | 7.36 | 5.06 |
| Component Material 2 | — | 0 | 100 | 2.11 | 0.28 | 4.39 | 1.17 |
| Position 1: Substrate/Film Interface | 0 | 31.2 | 68.8 | 2.34 | 0.45 | 6.00 | 2.54 |
| Position 2: Film Interior | 36.3 | 100 | 0 | 2.85 | 0.89 | 7.36 | 5.06 |
| Position 3: Air/Film Interface | 100 | 6.2 | 93.8 | 2.16 | .31 | 4.56 | 1.33 |

TABLE IV

| Phase Shifts of Attenuated Photomask Blanks Measured with PSI Tool | | | | | | | |
|---|---|---|---|---|---|---|---|
| Wave (nm) | Units | #3700 | #4300 | #4100 | #4200 | #3900 | #5000 |
| 325 | ° | 192 | 188 | 223 | 224 | 182 | 232 |
| 442 | ° | 156 | — | — | — | — | — |
| 488 (Inspec. Wave.) | ° | 142 | 134 | 151 | 153 | 120 | 171 |
| 633 (Align. Wave.) | ° | 103 | 102 | 110 | 111 | 83 | 132 |

Particular embodiments of the invention are illustrated in the examples. Other embodiments will become apparent to those skilled in the art from a consideration of the specification or practice of the invention disclosed herein. It is understood that modifications and variations may be practiced without departing from the spirit and scope of the novel concepts of this invention. It is further understood that the invention is not confined to the particular formulations and examples herein illustrated, but it embraces such modified forms thereof as come within the scope of the following claims.

What is claimed is:

1. A transmissive embedded phase shifter-photomask blank for a selected lithographic wavelength comprising an optically inhomogeneous attenuating film with an upper and lower surface, having a transmission of at least 0.001 at the lithographic wavelength and consisting essentially of a combination of at least two components, at least one of said components having a higher absorbance than at least one other component at the lithographic wavelength; wherein one depth from the upper surface of the film has a higher content of said higher absorbing component than another depth from the upper surface, and the profile of change in the refractive index, the profile of change in the extinction coefficient or both of said profiles is gradual through the film thickness; and wherein said profile of change and the film thickness are selected to provide a phase shift of about 180°, or an odd multiple thereof, at the selected lithographic wavelength.

2. The transmissive embedded phase shifter-photomask blank of claim 1 wherein the phase shift is about 180°.

3. The transmissive embedded phase shifter-photomask blank of claim 2 wherein the reflectance is within the range of from 0 to 0.5.

4. The transmissive embedded phase shifter-photomask blank of claim 2 which is essentially a combination of two components.

5. The transmissive embedded phase shifter-photomask blank of claim 4 wherein the two components are both dielectric components.

6. The transmissive embedded phase shifter-photomask blank of claim 4 or claim 5 wherein the higher absorbing component is from 85% to 5% of the film by volume and wherein the less absorbing component is from 15% to 95% of the film by volume.

7. The transmissive embedded phase shifter-photomask blank of claim 2 or claim 5 wherein the selected lithographic wavelength is from 110 nm to 1000 nm.

8. The transmissive embedded phase shifter-photomask blank of claim 7 wherein the components are M-O-C-N materials, M-Cl-O-C-N materials, M-Cl-F-O-C-N materials or M-F-O-C-N materials where M is selected from the group consisting of Cr, Fe, Mo, Zn, Co, Nb, Ta, W, Ti, Al, Mg, Si, and mixtures thereof.

9. The transmissive embedded phase shifter-photomask blank of claim 8 wherein M is Cr.

10. The transmissive embedded phase shifter-photomask blank of claim 9 wherein the components are Cr-O-C-N materials.

11. The transmissive embedded phase shifter-photomask blank of claim 1 wherein the profile of change in the refractive index is gradual through the film thickness.

12. The transmissive embedded phase shifter-photomask blank of claim 1 or of claim 11 wherein the profile of change in the extinction coefficient is gradual through the film thickness.

13. The photomask blank of claim 1 wherein the transmission at an inspection wavelength of 488 nm is for 0.05 to 0.90; and wherein the transmission at an alignment wavelength of 633 nm is from 0.10 to 0.90.

14. The photomask blank of claim 1 wherein the sheet resistance for I-line or G-line lithography is in the range of from $1 \times 10^2$ to $1 \times 10^9$ ohms/sq.

15. The transmissive embedded phase-shifter blank of claim 1 wherein the acetic acid etch rate is lower than the acetic acid etch rate of a Cr blank.

* * * * *